(12) United States Patent
Ozalevli et al.

(10) Patent No.: US 7,280,063 B2
(45) Date of Patent: Oct. 9, 2007

(54) PROGRAMMABLE VOLTAGE-OUTPUT FLOATING-GATE DIGITAL TO ANALOG CONVERTER AND TUNABLE RESISTORS

(75) Inventors: Erhan Ozalevli, Atlanta, GA (US); Paul Hasler, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 11/381,068

(22) Filed: May 1, 2006

(65) Prior Publication Data
US 2006/0244645 A1 Nov. 2, 2006

Related U.S. Application Data

(60) Provisional application No. 60/683,493, filed on May 20, 2005, provisional application No. 60/676,413, filed on Apr. 29, 2005, provisional application No. 60/676,414, filed on Apr. 29, 2005.

(51) Int. Cl.
*H03M 1/66* (2006.01)
(52) U.S. Cl. .................. 341/144; 341/154; 341/118
(58) Field of Classification Search ................ 341/118, 341/144, 154
See application file for complete search history.

(56) References Cited

U.S. PATENT DOCUMENTS

| 4,989,179 | A | 1/1991 | Simko |
| 5,235,273 | A | 8/1993 | Akar et al. |
| 5,349,351 | A | 9/1994 | Obara et al. |
| 5,585,795 | A | * | 12/1996 | Yuasa et al. ................ 341/118 |
| 5,623,279 | A | 4/1997 | Itakura et al. |
| 5,682,175 | A | 10/1997 | Kitamura |
| 5,808,576 | A | * | 9/1998 | Chloupek et al. ............ 341/144 |
| 6,094,153 | A | 7/2000 | Rumsey et al. |
| 6,483,448 | B2 | 11/2002 | Martin et al. |
| 6,937,179 | B1 | * | 8/2005 | Martin ........................ 341/154 |

OTHER PUBLICATIONS

Baird, Rex T. et al., "Improved ΔΣ DAC Linearity Using Data Weighted Averaging," School of Electrical Engineering and Computer Science, Washington State University,, pp. 13-16, IEEE, 1995, month unknown.
Cong, Lin et al., "A New Charge Redistribution D/A and A/D Converter Technique—Pseudo C-2C Ladder," Iowa State University, Proc. 43rd IEEE Midwest Symposium On Circuits and Systems, Lansing, MI, pp. 498-501, Aug. 8-11, 2000.
Cong, Lin, "Pseudo C-2C Ladder-Based Data Converter Technique," Transactions on Circuits and Systems-II: Analog and Digital Signal Processing, vol. 48, No. 10, pp. 927-929, Oct. 2001.

(Continued)

*Primary Examiner*—Jean Bruner Jeanglaude
(74) *Attorney, Agent, or Firm*—Seyed Kaveh E. Rashidi-Yazd, Esq.; Troutman Sanders LLP

(57) ABSTRACT

A digital to analog converter (DAC) includes an operational amplifier and a plurality of ladder elements. Each ladder element includes an epot for providing a voltage, a capacitor, and a switch for selecting between a first voltage and a reference voltage, and for providing the first selected voltage to the first capacitor. The output of the ladder elements are coupled to the inverting input of the operational amplifier. Alternatively, the ladder elements may use tunable floating-gate resistors.

14 Claims, 11 Drawing Sheets

OTHER PUBLICATIONS

Ozalevli Erhan et al, "Programmable Voltage-Output, Floating-Gate Digital Analog Converter," Georgia Institute of Technology Electrical and Computer Engineering, Proceedings of the International Symposium on Circuits and Systems, ISCAS '04, vol. 1, pp. 1-1064-1067, May 23-26, 2004.

Ozalevli, Erhan et al., "10-Bit Programmable Voltage-Output Digital-Analog Converter," Georgia Institute of Technology Electrical and Computer Engineering, IEEE International Symposium on Circuits and Systems, ISCAS 2005, vol. 6, pp. 5553-5556, May 23-26, 2005.

Galton, Ian, "Noise-Shaping D/A Converters for ΔΣ Modulation," University of California, IEEE International Symposium On Circuits and Systems, pp. 441-444, 1996, month unknown.

Harrison, Reid R. et al., "A CMOS Programmable Analog Memory-Cell Array Using Floating-Gate Circuits," IEEE Transactions on Circuits and Systems-II: Analog and Digital Signal Processing, vol. 48, No. 1, pp. 4-11, Jan. 2001.

Leung, Bosco H. et al., "Multibit Σ Δ A/D Converter Incorporating A Novel Class of Dynamic Element Matching Techniques," IEEE Transactions on Circuits and Systems-II: Analog and Digital Signal Processing, vol. 39, No. 1, pp. 35-51, Jan. 1992.

McCreary, James L. et al., "All-MOS Charge Redistribution Analog-to-Digital Conversion Techniques-Part 1," IEEE Journal of Solid-State Circuits, vol. SC-10, No. 6, pp. 371-379, Dec. 1975.

McCreary, James L., "Matching Properties, and Voltage and Temperature Dependence of MOS Capacitors," IEEE Journal of Solid-State Circuits, vol. SC-16, No. 6, pp. 608-616, Dec. 1981.

Schreier, R. et al., "Noise-Shaped Multbit D/A Converter Employing Unit Elements," Electronics Letters, vol. 31, No. 20, pp. 1712-1713, Sep. 28, 1995.

Shyu, Jyn-Bang et al., "Random Errors in MOS Capacitors," IEEE Journal of Solid-State Circuits, vol. SC-17, No. 6, pp. 1070-1076, Dec. 1982.

Shyu, Jyn-Bang et al., "Random Error Effects in Matched MOS Capacitors and Current Sources," IEEE Journal of Solid-State Circuits, vol. SC-19, No. 6, pp. 948-955, Dec. 1984.

Singh, S.P. et al., "C-2C Ladder-Based D/A Converters for PCM Codecs," IEEE Journal of Solid-State Circuits, vol. SC-22, No. 6, pp. 1197-1200, Dec. 1987.

Singh, S.P. et al., "Design Methodologies for C-2C Ladder-Based D/A Convertors for PCM Codecs," IEEE Proceedings, vol. 135, Pt. G, No. 4, pp. 133-140, Aug. 4, 1988.

Singh Rajinder et al., "Matching Properties of Linear MOS Capacitors," IEEE Transactions on Circuits and Systems, vol. 36, No. 3, pp. 465-467, Mar. 3, 1989.

Singh, Rajinder et al., " A Fast and Area-Efficient BWC Array D/A and A/D Conversion Scheme," IEEE Transactions on Circuits and Systems, vol. 36, No. 6, pp. 912-916, Jun. 6, 1989.

Yee, Y.S. et al., "A Two-Stage Weighted Capacitor Network for D/A-A/D Conversion," IEEE Journal of Solid-State Circuits, vol. SC-14, No. 4, pp. 778-781, Aug. 1979.

Bleiker Christoph et al., "A Four-State EEPROM Using Floating-Gate Memory Cells," IEEE Journal of Soild-State Circuits, vol. SC-22, No. 3, pp. 460-463, Jun. 1987.

Brooks, Todd L. et al., "A Cascaded Sigma-Delta Pipeline A/D Converter with 1.25 MHz Signal Bandwidth and 89 dB SNR," IEEE Journal of Solid-State Circuits, vol. 32, No. 12, pp. 1896-1906, Dec. 6, 1997.

Candy, James C., "A Use of Double Integration in Sigma Delta Modulation," IEEE Transactions on Communications, vol. COM-33, No. 3, pp. 249-258, Mar. 1985.

Ozalevli, Erhan et al., "Design of a Binary-Weighted Resistor DAC Using Tunable Linearized Floating-Gate CMOS Resistors," Georgia Institute of Technology School of Electrical and Computer Engineering, Proceedings of the IEEE Custom Integrated Circuits Conference, Sep. 10-13, 2006.

Goes, João et al., "Systematic Design for Optimization of High-Speed Self Calibrated Pipelined A/D Converters," IEEE Transactions on Circuits and Systems-II: Analog and Digital Signal Processing, vol. 45, No. 12, pp. 1513-1526, Dec. 1998.

Lewis, Stephen, "Optimizing the State Resolution in Pipelined, Multistage, Analog-to-Digital Converters for Video-Rate Applications," IEEE Transactions on Circuits and System-II: Analog and Digital Signal Processing, vol. 39, No. 8, pp. 516-523, Aug. 1992.

Srinivasan, Venkatesh et al., "A Precision CMOS Amplifier Using Floating-Gates for Offset Cancellation," Georgia Institute of Technology School of Electrical and Computer Engineering, IEEE 2005 Custom Integrated Circuits Conference, pp. 739-742, month unknown.

Alarcón, E. et al., "D-MRC: Digitally Programmable MOS Resistive Circuit," Departamento de Ingenieria Electrónica, Escuela Superior de Ingenieros de Telecommunicación de Barcelona, Universitat Politécnica de Catalunya (UPC), Barcelona, Spain, pp. 215-218, IEEE 2001, month unknown.

Alarcón, E. et al., "Digitally Programmable MOS Resistive Circuit," Electronics Letters, vol. 38, No. 1, pp. 11-13, Jan. 3, 2002.

Babanezhad, Joseph N. et al., "A Linear NMOS Depletion Resistor and Its Appication in an Integrated Amplifier,"IEEE Journal of Solid-State Circuits, vol. SC-19, No. 6, pp. 932-938, Dec. 1984.

Yu, Baiying et al., "Voltage Controlled Resistor for Mismatch Adjustment in Analog CMOS, Circuits ," Analog and Mixed-Signal design Center, Department of Electrical and Computer Engineering, Iowa State University, pp. I-563-I-566, IEEE 1998, month unknown.

Banu, Mihai et al., "FAM 17.4: Fully Integrated Active RC Filters in MOS Technology,", Columbia University/Bell Laboratories, IEEE International Solid-State Circuits Conference, pp. 244, 245, 313, Feb. 25, 1983.

Chan, P.K. et al., "A Family of CMOS Linear Resistors," School of Electronic, Communication & Electrical Engineering, University of Plymouth, Devon, pp. 2/1-2/5, date unknown.

Czarnul, Zdzislaw, Comments on "A Linear NMOS Depletion Resistor and Its Application in an Integrated Amplifier," IEEE Journal of Solid-State Circuits, vol. SC-22, No. 1, pp. 124-127, Feb. 1987.

Dejhan, Kobchai et al., "A CMOS Voltage-Controlled Grounded Resistor Using a Single Power Supply," International Symposium on Communications and Information Technologies 2004 (ISCIT 2004), pp. 124-127, Sapporo, Japan, Oct. 26-29, 2004.

Ozalevli, Erhan et al., "Programmable Floating-Gate CMOS Resistors," Georgia Institue of Technology School of Electrical and Computer Engineering, IEEE International Symposium on Circuits and Systems, ISCAS 2005, pp. 2168-2171 May 23-26, 2005.

Ozalevli, Erhan et al., "Design of a CMOS Floating-Gate Resistor for Highly Linear Amplifier and Multiplier Applications," Georgia Institute of Technology School of Electrical and Computer Engineering, Proceedings of the IEEE Custom Integrated Circuits Conference, pp. 735-738, Sep. 18-21, 2005.

Ozalevli, Erhan et al., "A Tunable Floating Gate CMOS Resistor for Low-Power and Low-Voltage Applications," Georgia Institute of Technology School of Electrical and Computer Engineering, Proceedings of the IEEE International Symposium on Circuits and Systems, pp. 4273-4276, May 21-24, 2006.

Wang, Zhenhua et al., "A Voltage-Controllable Linear MOS Transconductor Using Bias Offset Technique," IEEE Journal of Solid-State Circuits, vol. 25, No. 1, pp. 315-317, Feb. 1990.

Graham, David W. et al., "Indirect Programming of Floating-Gate Transistors," Georgia Institute of Technology School of Electrical and Computer Engineering, pp. 2172-2175, IEEE 2005, month unknown.

Kushima, Muneo et al., "Design of a Floating Node Voltage-Controlled Linear Variable Resistor Circuit," The 47th IEEE International Midwest Symposium on Circuits and Systems, pp. I-85-I-88, 2004, month unknown.

Kushima, Muneo et al., "Low-Power and Wide-Input Range Voltage Controlled Linear Variable Resistor Using an FG-MOSFET and Its Application," Faculty of Engineering, Miyazaki University, Miyazaki 889-2192, Japan, date unknown.

Lande, T.S. et al., "Resistive Equivalents in CMOS," Electronics Letters, vol. 39, No. 17, pp. 1233-1235, Aug. 21, 2003.

Mahmoud Soliman A., "A Low Voltage CMOS Floating Resistor,"Electronics and Communications Engineering Department, Cairo University, Fayoum Campus, Fayoum, Egypt, pp. 453-456, IEEE 2004, month unknown.

Nay, K. et al., "A Voltage-Controlled Resistance with Wide Dynamic Range and Low Distortion," Circuits and Systems Letters, IEEE Transactions on Circuits and Systems, vol. CAS-30, No. 10, pp. 770-772, October 1983.

Oura, Takao et al., "A Threshold Voltage Independent Floating Resistor Circuit Exhibiting Both Positive and Negative Resistance Values," Department of Systems Engineering, Faculty of Engineering, Shizuoka University, Japan, pp. III-739-III-742, IEEE 2002, month unknown.

Papazoglou, C.A. et al., "Electronically-Tunable Floating CMOS Resistor Independent of the MOS Parameters and Temperature," Laboratory of Electronics, Section of Electronics and Computers, Department of Physics, Aristotle University of Thessaloniki, Greece, pp. 311-314, IEEE 1999, month unknown.

Kim, Young Hwan et al., "A New Floating Voltage-Controlled CMOS Resistor Linear Over a Wide Input Voltage Range," Department of Electrical Engineering Korea Advanced Institute of Science & Technology, pp. 1912-1915, Korea, (no date).

Popa, Cosmin et al., "Low-Power CMOS Active Resistor Independent on the Threshold Voltage," University Politehnica Bucharest, Romania; Darmstadt University of Technology, Institute of Microelectronic Systems, Germany, pp. 57-60, IEEE 2002, month unknown.

Prommee, Pipat et al., "A Compensated Temperature CMOS Voltage-Controlled Grounded Resistance Circuit," Faculty of Engineering and Research Center for Communication and Information Technology, King Mongkut's Institute of Technology, Thailand, pp. 298-301, IEEE 2004, month unknown.

Rasmussen, Angela et al., "CMOS Analog Implementation of Cellular Neural Network to Solve Partial Differential Equations with a Micro Electromechanical Thermal Interface," Department of Electrical Engineering and Computer Science, The George Washington University, pp. 1326-1329, IEEE 1997, month unknown.

Sakurai, Satoshi et al., "A CMOS Square-Law Programmable Floating Resistor Independent of the Threshold Voltage," IEEE Transactions on Circuits and Systems-II: Analog and Digital Signal Processing, vol. 39, No. 8, pp. 565-574, Aug. 1992.

Sakurai, Satoshi et al., "A CMOS Square-Law Programmable Floating Resistor," Ohio State University Department of Electrical Engineering; The Ohio State University on leave at the Norwegian Inst. Tech. Phys. Elec., Norway, pp. 1184-1187, IEEE 1993. month unknown.

Sellami, L. et al., "Linear Bilateral CMOS Resistor for Neural-Type Circuits," Microsystems Laboratory, Electrical Engineering, University of Maryland; Department of Electronics Engineering, Hallym University, Korea, pp. 1330-1333, IEEE 1997, month unknown.

Sellami, L. et al., "CMOS Bilateral Linear Floating Resistors for Neural-Type Cell Arrays," Microsystems Laboratory, Electrical Engineerning, University of Maryland; Department of Electrical Engineering and Computer Science, The George Washington University, pp. 1136-1140, IEEE 1998, month unknown.

Shibata, Tadashi et al., "A Functional MOS Transistor Featuring Gate-Level Weighted Sum and Threshold Operations," IEEE Transactions on Electron Devices, vol. 39, No. 6, pp. 1444-1455, Jun. 1992.

Silva-Martinez, J. et al., "Very Linear CMOS Floating Resistor," Electronics Letters, vol. 26, No. 19, pp. 1610-1611, Sep. 13, 1990.

Singh, S.P. et al., "A New Floating Resistor for CMOS Technology," Transaction Briefs, IEEE Transactions on Circuits and Systems, vol. 36, No. 9, pp. 1217-1220, Sep. 1989.

Tadić, Nikša et al., "A Voltage-Controlled Resistor in CMOS Technology Using Bisection of the Voltage Range," IEEE Transactions on Instrumentation and Measurement, vol. 50, No. 6, pp. 1704-1710, Dec. 2001.

Tadić, Nikša et al., "A Floating Negative-Resistance Voltage-Controlled Resistor," IEEE Instrumentation and Measurement Technology Conference, Budapest, Hungary, pp. 437-442, May 21-23, 2001.

Tantry, Shashidhar et al., "Two Floating Resistor Circuits and Their Applications to Synaptic Weights in Analog Neural Networks," Department of Systems Engineering, Shizuoka University, Japan, pp. I-564-1567, IEEE 2001, month unknown.

Tantry, Shashidhar et al., "A Low Voltage Floating Resistor Having Positive and Negative Resistance Values," Department of Systems Engineering, Shizuoka University, Japan; NEC Electron Devices, pp. 347-350, IEEE 2002, month unknown.

Tantry, Shashidhar et al., "A Floating Resistor with Positive and Negative Resistance Operating at Lower Supply Voltages," Department of Systems Engineering, Shizuoka University, Japan; NEC Electron Devices, Japan, date unknown.

Tsividis, Yannis et al., "Continuous-Time MOSFET-C Filters in VLSI," IEEE Journal of Solid-State Circuits, vol. SC-21, No. 1, pp. 15-30, Feb. 1986.

Tantry, Shashidhar et al., "A Floating Resistor with Positive and Negative Resistance Operating at Lower Supply Voltages," Department of Systems Engineering, Shizuoka University, Japan; NEC Electron Devices, Japan, date unknown.

Tsividis, Yannis et al., "Linear, Electronically Tunable Resistor," Electronics Letters, vol. 28, No. 25, pp. 2303-2305, Dec. 3, 1992.

Tsividis, Yannis et al., "Linear, Electronically Tunable Resistor," Electronics Letters, vol. 29, No. 6, pp. 556-557, Mar. 18, 1993.

Vavelidis, K. et al., "Design Considerations for a Highly Linear Electronically Tunable Resistor," Division of Computer Science, National Technical University of Athens, Greece, pp. 1180-1183, IEEE 1993, month unknown.

Vavelidis, K. et al., "Six-Terminal MOSFET's: Modeling and Applications in Highly Linear, Electronically Tunable Resistors," IEEE Journal of Solid-State Circuits, vol. 32, No. 1, pp. 4-12, Jan. 1997.

Vavelidis, K. et al., "R-MOSFET Structure Based on Current Division," Electronics Letters, vol. 29, No. 9, pp. 732-733, Apr. 29, 1993.

Wang, Z., "Current-Controlled Linear MOS earthed and Floating Resistors and Their Application," IEE Proceedings, vol. 137, Pt. G., No. 6, pp. 479-481, Dec. 1990.

Wang, Z., "Novel Electronically-Controlled Floating Resistors Using MOS Transistors Operating in Saturation," Electronics Letters, vol. 27, No. 2, pp. 188-189, Jan. 17, 1991.

Wilson, G. et al., "Novel Voltage-Controlled Grounded Resistor," Electronics Letters, vol. 25, No. 25, pp. 1725-1726, Dec. 7, 1989.

Wilson, G. et al., "CMOS Series/Parallel Quad Resistor," Electronics Letters, vol. 28, No. 3, pp. 335-336, Jan. 30, 1992.

Wilson, G. et al., "Floating CMOS Resistor," Electronics Letters, vol. 29, No. 3, pp. 306-307, Feb. 4, 1993.

Wilson, G. et al., "Analysis of Nonlinearities in MOS Floating Resistor Networks," IEE Proc.-Circuits Devices Syst., vol. 141, No. 2, pp. 82-88, Apr. 1994.

Youssef, H. et al., "A CMOS Voltage-Controlled Linear Resistor with Wide Dynamic Range," Electrical Engineering Department, University of Maryland, pp. 681-684, IEEE 1989, month unknown.

\* cited by examiner

US 7,280,063 B2

PROGRAMMABLE VOLTAGE-OUTPUT FLOATING-GATE DIGITAL TO ANALOG CONVERTER AND TUNABLE RESISTORS

CROSS REFERENCE TO RELATED APPLICATIONS

This application claims priority of U.S. Provisional Patent Application Nos. 60/676,413 and 60/676,414, both filed 29 Apr. 2005, and U.S. Provisional Patent Application No. 60/683,493, filed 20 May 2005, the entire contents and substance of which are hereby incorporated by reference.

BACKGROUND

1. Field of the Invention

The present invention relates to a digital-to-analog converter and, more particularly, to a compact, low-power, digital to analog converter employing floating-gate technology.

2. Description of Related Art

It is often desirable to convert signals between the analog and digital domains. For example, most audio files are stored in digital form, such as MP3s and compact disks. These digital files must be converted to an analog signal in order to be heard through a speaker. This transformation is typically carried out using a digital to analog converter ("DAC"), which converts digital signals into analog signals.

Today, DACs are used in numerous applications. Often, it is desirable for the DACs to be small, fast, accurate, and consume a small amount of power. For example, it is generally desirable for MP3 players to be very small and to have a long battery life. In order to accomplish this, it is desirable to optimize each component to reduce its size and its power consumption.

Using conventional DACs, designers may not be able to provide a suitably small and efficient product without sacrificing quality and performance. Customers, however, desire superior products in small packages. Hence, in many DAC applications designers sacrifice speed and accuracy for size.

FIG. 1 is a schematic diagram illustrating a conventional DAC 100. As shown in FIG. 1, a DAC 100 may include an operational amplifier ("op-amp") 110 connected to a ladder network 120 of capacitors ($C_1$-$C_n$) 122a-d (collectively 122). Each capacitor 122 in the ladder network 120 is connected in parallel to each other capacitor 122 and is connected through a bit selection switch 130a-d (collectively 130) to a reference voltage ($V_{ref}$) on one end and to the inverting input 114 of the op-amp 110 on the other end. The reference voltage is also connected to the non-inverting input 112 of the op-amp 110. The op-amp 110 in the DAC 100 is typically configured as in integrator with a feedback capacitor $C_f$ 124 connected between the output 116 of the op-amp 110 and the inverting input 114.

In operation, each leg of the ladder network 120 represents one bit of data. The capacitors 122 may be selected so that the voltage measured at the output of the op-amp 110 is a predetermined value when only that capacitor is selected in the circuit 100. In order to achieve desired results, the capacitors 122 are typically selected such that each successive capacitor in the ladder has a capacitance double the one before it. Thus, in such an embodiment, $C_1$ equals a predetermined base value and $C_2=2C_1$; $C_3=4C_1$; $C_4=8C_1$; and $C_n 2^{n-1} C_n$.

The increase in value of the capacitor 122 for each successive bit of resolution results in increasingly larger capacitor sizes. When embodied in CMOS technologies, the value of the capacitor 122 substantially corresponds to the size of the capacitor 122. Thus, using the embodiment above, $C_2$ takes up approximately twice the surface area as $C_1$. Furthermore, larger capacitors consume more power as it takes more power to charge the capacitor. Thus, since each bit of resolution requires an additional capacitor leg in the ladder network 120, each successive bit of resolution significantly increases the space and power requirements of the DAC.

In certain embodiments, DACs have been implemented using resistive networks, instead of capactive networks. Often, this is not a suitable solution in CMOS because such resistors typically have large footprints, consume a large amount of power, and tend to be inaccurate. In standard CMOS technology, resistors are implemented by utilizing passive devices such as polysilicon, diffusion, or well strips. These resistors typically consume large chip areas to realize high resistance values and further require laser trimming or other trimming techniques to achieve precise values.

Accordingly, there is a need in the art for a DAC that is smaller than conventional DACs.

Additionally, there is a need in the art for a DAC that consumes less power than conventional DACs.

Additionally, there is a need in the art for a DAC that provides high resolution without requiring great surface area on a silicon substrate.

Additionally, there is a need in the art for a DAC that has a fixed surface area requirement for each leg of the ladder network.

Additionally, there is a need in the art for resistors to be implemented in a smaller footprint.

Additionally, there is a need in the art for tunable CMOS resistors that are easy to manufacture and provide high accuracy.

BRIEF SUMMARY

The present invention provides a digital to analog converter (DAC) using floating-gate technology. Various embodiments of the present invention overcome the deficiencies in the prior art, by providing a small, low power, and accurate DAC suitable for fabrication in standard CMOS technologies.

In an exemplary embodiment, the digital to analog converter includes an operational amplifier, and a plurality of ladder elements. Each ladder element includes an epot for providing a voltage, a capacitor, and a switch for selecting a first voltage or a reference voltage as a selected voltage. The epots may provide the selected voltage to the input of the capacitor. The output of the ladder elements are coupled to the inverting input of the operational amplifier.

In another exemplary embodiment, the digital to analog converter includes an operational amplifier, and a plurality of ladder elements. Each ladder element includes a floating gate tunable resistor, and a switch for alternatively connecting the input of the floating gate tunable resistor to either a first voltage or to a second voltage. The output of the ladder elements are connected to the inverting input of the operational amplifier.

In an exemplary embodiment, a floating gate tunable resistor may include a programming circuit having a first floating gate transistor with a first source, a first floating gate, and a first drain. The floating gate tunable resistor can further include a resistor circuit having a second floating gate transistor with a second source, a second floating gate, and a second drain. The first floating gate of the programming circuit and the second floating gate of the resistor circuit are electrically coupled together.

These and other objects, features and advantages of the present invention will become more apparent upon reading the following specification in conjunction with the accompanying drawing figures.

DETAILED DESCRIPTION OF PREFERRED EMBODIMENTS

Figure 1:
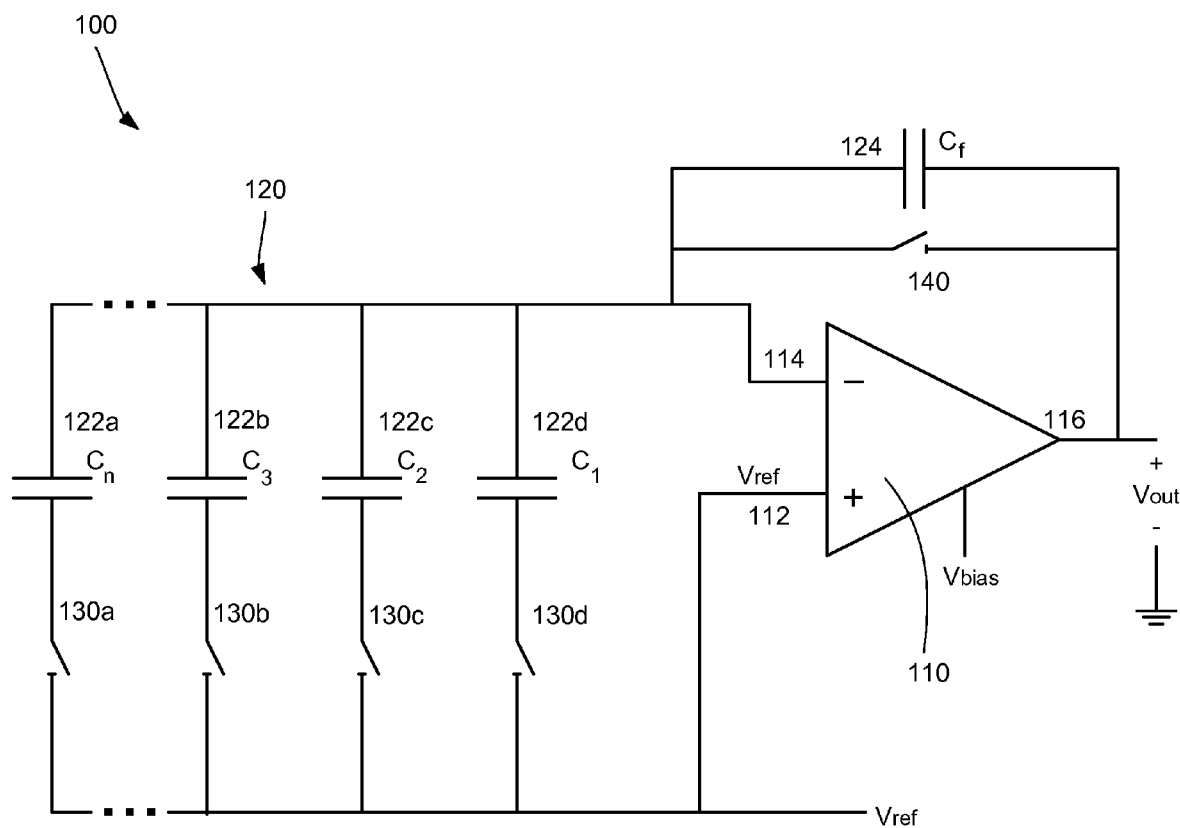
FIG. 1 is a schematic diagram illustrating a conventional digital to analog converter.

To facilitate an understanding of the principles and features of the invention, it is explained hereinafter with reference to its implementation in illustrative embodiments. In particular, the present invention is directed toward a digital to analog converter.

Referring now to the figures, wherein like reference numerals represent like parts throughout the several views, exemplary embodiments of the present invention will be described in detail. Throughout this description, various components may be identified having specific values, these values are provided as exemplary embodiments and should not be limiting of various concepts of the present invention as many comparable sizes and/or values may be implemented.

Figure 2:
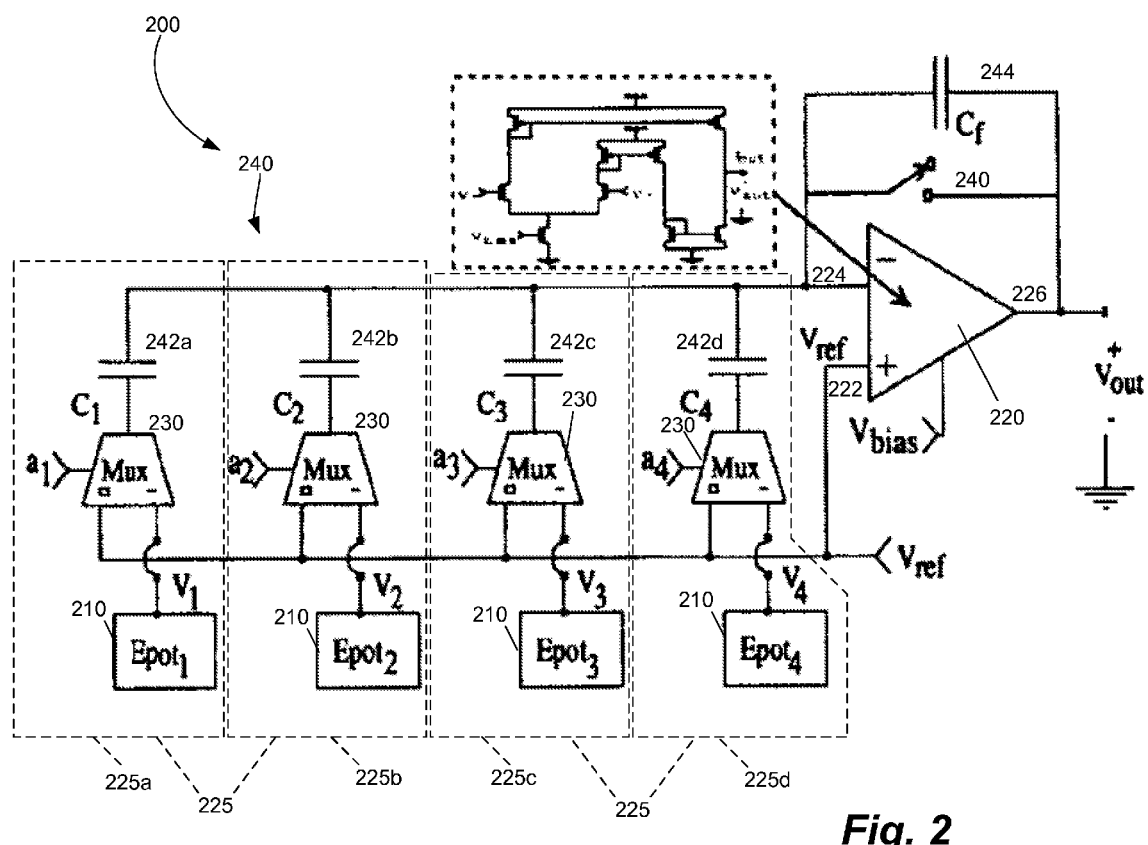
FIG. 2 is a schematic diagram illustrating a digital to analog converter, in accordance with an exemplary embodiment of the present invention.

FIG. 2 is a schematic diagram illustrating a four-bit Digital to Analog Converter (DAC) 200 in accordance with an exemplary embodiment of the present invention. The DAC illustrated in FIG. 2 overcomes the deficiencies of the prior art by providing an electronic potentiometer (hereafter "epot") to drive each capacitor in the ladder network of the DAC. The incorporation of epots 210 into the DAC circuit 200 allows the voltage input for each capacitor 242a-d (collectively hereafter "242") in the ladder network 240 to be customized. Specifically, by customizing the input voltage to each capacitor 242, the DAC may be implemented using a substantially constant size capacitor on each leg 225 of the ladder network 240. Thus, rather than feeding a constant voltage source through ever increasing capacitor sizes, similar, or improved, results may be achieved by feeding a varying input voltage through substantially equal capacitors. While it may be preferable for the capacitors 242 to be nearly equal in size, the benefits of the present invention may be realized with capacitors 242 having some variation in size and value. For example, the various capacitors may vary by 25%, however, it is typically preferable for each capacitor to be within 5% of one another. The results achieved are significant for many reasons. First, each leg (or ladder element) 225 (e.g., first ladder element 225a, second ladder element 225b, etc.) of the ladder network 240 is of a substantially equal size. Second, the power consumed by each leg 225 of the ladder network 240 is similar. It should be noted that, due to the constant size of each leg 225 of the ladder network 240, the $n^{th}$ bit of precision consumes approximately the same amount of space as the $1^{st}$ bit. Thus, those of ordinary skill in the art will appreciate that higher orders of precision may be realized without greatly sacrificing space or power.

In an exemplary embodiment of the present invention, the circuit of FIG. 2 may be fabricated using a 0.5 μm CMOS process. Results of the DAC circuit 200 show that the present invention may limit, if not eliminate, problems caused by an increase in element size/value, by using equal capacitance, thereby acquiring accurate results.

The epots 210 incorporated into the design provide several benefits and are useful for decreasing, or even eliminating, issues resulting from device mismatch. For example, if the capacitors 242 in the ladder network 240 are significantly different from one another, the epots 210 may be fine tuned to provide desired output voltages despite the inaccuracies of the capacitors. The epots 210 provide dynamically adjustable, non-volatile, on-chip reference voltages. The use of a plurality of epots 210 allows a distinct input voltage to be supplied to each of a plurality of capacitors 242, rather than providing a fixed reference input voltage (i.e., $V_{ref}$). This approach may improve the accuracy and speed of the DAC's performance, and may eliminate or reduce element spread and non-monotonicity. Relatively constant bias voltages can be achieved by using the epots 210. In this way, reference voltages $V_1$, $V_2$, $V_3$, and $V_4$, from the epots 210, can be programmed to minimize mismatch between the capacitors. Further, the epots 210 may be optimized to produce a desired output voltage through the op-amp 220 for each bit.

As shown in FIG. 2, an op-amp 220 is connected to the ladder network. Each bit (a1-a4) of the digital signal selects an input on a mux 230 to determine whether the voltage reference or the output of an epot will be fed to each respective capacitor 242. For example, bit a1 determines whether mux 230 will provide $V_{ref}$ or the output of epot1 to capacitor $C_1$ 242a. The charges on each capacitor 242 are then added together and fed to the inverting input 224 of the op-amp 220. The op-amp 220 may be configured as an integrator and produces an output voltage Vout as a function of the charges on each capacitor in the ladder network and the reference voltage ($V_{ref}$).

A wide range transconductance amplifier may be implemented as the charge amplifier 220. V+ and V− are input voltages of the amplifier 220, and $V_{bias}$ is a bias voltage of the amplifier 220.

A switch 230 may be used to reset the output voltage. By using the circuit 200, two DAC configurations may be implemented. Preferably, a configuration with a plurality of capacitors having equal capacitance, e.g., $C_1=C_2=C_3=C_4$, is implemented. This configuration may reduce power consumption of the circuit 200, and further reduce size of the circuit 200. Alternatively, a ratio capacitance, like conventional designs, e.g., $C_1=2C_2=4C_3=8C_4$, may be implemented, but such an embodiment may not reduce the power and size of the circuit 200 as effective as the equal capacitance configuration.

The resolution of the four-bit DAC, shown in FIG. 2, may be directly extended to n-bits by increasing the number of capacitors 242 and epots 210 using the same ladder network 240 relationship. The input capacitances together with input voltages sets the total charge stored at the inverting input 224 of the amplifier 220. The total charge at the input side is the sum of the charges at each input capacitor. Also, the charge stored on the two capacitors in series should be equal, therefore, the output voltage changes accordingly to compensate for the charge stored in a feedback capacitor.

There are at least two cases to consider from the circuit 200: 1) when the switch 240 is closed, and 2) when the switch 240 is open. In the first case, multiplexers 230 connect the capacitors 242 to the reference voltage ($V_{ref}$) and the switch shorts the feedback capacitance ($C_f$) 244. In this way, all capacitors are discharged to the reference voltage ($V_{ref}$). In the second case, however, multiplexers 240 can choose between reference and epot voltages, resulting in the desired output voltage.

In an exemplary embodiment, the wide-range amplifier may be used as the charge amplifier 220, instead of a simple transconductance amplifier, as is often used in conventional DACs. Consequently, both the input voltage and the output voltage may be driven almost up to $V_{dd}$, and almost down to ground, and conventional problems with $V_{min}$ may be limited, if not eliminated. In addition, the output current becomes independent of the output voltage.

Implementation of this embodiment provides improvements in INL (integral non-linearity) and DNL (differential non-linearity). By controlling voltages of the epot 210 with a twelve-bit analog to digital converter (ADC) connected to a computer, seven-bit linearity may be obtained for the binary-weighted capacitance floating-gate digital to analog converter (FGDAC) (FGDAC and DAC are used interchangeably hereinafter), and nine-bit linearity may be achieved with the equal capacitance FGDAC. This illustrates that more accurate results may be obtained by using less capacitance. In this manner, the large element spread in the binary-weighted capacitance FGDAC can be reduced, if not eliminated, and the linearity may be better controlled and improved, compared to conventional DAC circuits.

One skilled in the art will appreciate that the epots can be programmed by various methods and systems. In an exemplary embodiment, as described, an ADC is employed in programming an epot.

These results can be illustrated mathematically by analyzing the static characteristics of FGDACs. First, the output voltage of the FGDAC can be derived by employing basic concepts of the charge amplifier. Ideally, a charge stored in the capacitances of the charge amplifier 220 circuit can be expressed as:

$$Q_{total}(\text{input}) = Q_f = Q_{ideal} \sum_{i=1}^{n} a_i 2^{-(i-1)} \quad (1)$$

where $a_i$ is a digital bit, and $Q_{ideal}$ is an ideal stored charge in a first capacitance. Other input charges are weighted accordingly relative to $Q_{ideal}$ for the ideal operation of the DAC. In the above equation (1), if the charges are represented in terms of voltages and capacitances, then the output voltage can be formulated as:

$$V_{ref} - V_{out} = \frac{1}{C_f}\left(\sum_{i=1}^{n} a_i C_i (V_i - V_{ref})\right) \quad (2)$$

For the binary-weighted capacitance (bwc) FGDAC, where $C_1=2C_2=4C_3=8C_4=C_{bwc}$, and $C_f=2C_{bwc}/K_{bwc}$, the output voltage of the circuit can be expressed as:

$$V_{ref} - V_{out} = K_{bwc}\left(\sum_{i=1}^{n} \frac{a_i}{2^i}(V_i - V_{ref})\right) \quad (3)$$

Also, for the equal capacitance (eqc) FGDAC, where $C_1=C_2=C_3=C_4=C_{eqc}$, and $C_f=C_{eqc}/K_{eqc}$, the output voltage becomes:

$$V_{ref} - V_{out} = K_{eqc}\left(\sum_{i=1}^{n} a_i (V_i - V_{ref})\right) \quad (4)$$

Second, the binary-weighted and equal capacitance FGDACs can be characterized by deriving their static characteristics in terms of INL. INL can be found by considering the difference between the ideal and actual voltage output and can be expressed as:

$$INL(j) = \quad (5)$$
$$V_{out}(\text{actual}) - V_{out}(\text{ideal}) = \frac{1}{C_f}\sum_{i=1}^{n} a_i (Q_{ideal} 2^{-(i-1)} - C_i(V_i - V_{ref}))$$

where j is a digital input code that determines the value of $a_i$. In an exemplary embodiment, it can be assumed that the charges on the capacitors are weighted relative to $Q_{ideal}$. In contrast to conventional designs, where the control of the INL value is limited to the tolerance of the capacitors and the LSB (least significant bit) value, FGDAC introduces another parameter, programmable input voltage ($V_i$), to the INL calculation. Hence, the value of INL can be minimized or limited by optimizing $V_i$ for each individual capacitor.

If advantages of the equal capacitance FGDAC over the binary-weighted capacitance FGDAC are shown in terms of the precision of programmability, then mathematics can further illustrate the analysis of linearity limitations of these designs. Hence, for the $i^{th}$ bit, the design can be monotonic, if the error is less than half of the LSB. This can be expressed as:

$$Q_{ideal}2^{-(i-1)} - C_i(V_i - V_{ref}) < \frac{LSB}{2} \quad (6)$$

where, for an n-bit resolution DAC, LSB may be defined in terms of the stored charge as follows:

$$LSB = C_f \frac{(V_{max} - V_{min})}{2^n - 1} \quad (7)$$

where $V_{max}$ and $V_{min}$ correspond to the output voltages for digital input codes with all zeros and all ones, respectively. Incorporating this into equation (6), the result is:

$$\frac{C_i}{C_f}\left(\frac{V_i(\text{actual}) - V_i(\text{ideal})}{V_{max} - V_{min}}\right) < \frac{1}{2(2^n - 1)} \quad (8)$$

If the second term is defined as a precision of programmability, P, then the final expression becomes:

$$P < \frac{C_f}{C_i} \frac{1}{2(2^n - 1)} \quad (9)$$

In this expression, P can be an indication of INL for the $i^{th}$ bit selected, and a measurement of the precision needed to compensate for the error.

In equation (9), the precision of programmability is limited by $C_i$. In a worst case of the binary-weighted FGDAC, as the MSB (most significant bit) capacitance increases with the resolution of DAC, P drops inversely, which means a precise input voltage is required to increase the linearity of the FGDAC.

For the equal capacitance FGDAC, P depends on the value of the capacitance, but not on the resolution of the FGDAC. Therefore, the precision of programmability of the equal capacitance FGDAC is limited by the precision of the input voltage.

In order to understand the results of the measurements in terms of the derived mathematical expressions, data may be analyzed in consideration of an experimental setup. First, the equal capacitance FGDAC is composed of capacitors that have the same capacitance as the LSB capacitor of the binary-weighted FGDAC. Second, for these four bit resolution FGDACs, input epot voltages may be programmed utilizing a twelve bit DAC, which may preferably operate between ±5V. Assuming that the output voltages of the FGDACs have a range of approximately 2.5V, which corresponds to a ten bit voltage control range, nine bits of linearity may be obtained with the equal capacitance FGDAC. For the same conditions, the binary-weighted capacitance FGDAC may yield seven bit linearity, which is expected to be less than that of equal capacitance FGDAC. Hence, the MSB capacitor of the binary-weighted FGDAC is approximately eight times larger than the sum of the sizes of the capacitors of the equal capacitance FGDAC embodiment.

Another DAC metric to consider is its dynamic behavior. Speed of the conventional charge amplifier DAC is limited by the op amp. Therefore, the conversion speed is generally determined by the capacitance, the switch resistance, and op amp parameters (the unity-gain bandwidth, the settling time, and the slew rate).

The voltage gain, $A_{vd}(s)$, of the op amp may be expressed as:

$$A_{vd}(s) = \frac{A_{vd}(0)}{1 + s\tau} \quad (10)$$

where $A_{vd}(0)$ is the low-frequency differential voltage gain, GB is the unity-gain bandwidth, and $\tau$ is the time constant of the op amp. By utilizing the small signal model and equation (10), the frequency response of the overall system becomes a second order function that may be represented for $A_{vd}(0) \gg 1$ as follows:

$$\frac{V_{out}(s)}{V_{in}(s)} = -H_0 \frac{1}{1 + (\tau_1 + \tau_2)s + \tau_1\tau_2 s^2} \quad (11)$$

where the low frequency gain is $H_0 = C_1/C_f$ and $\tau_1$ may be expressed in terms of $\tau$ of the op amp, and $\tau_2$ may be represented in terms of resistance and input capacitance as follows:

$$\tau_1 = \frac{\tau}{A_{vd}} = \frac{C_{Load}}{g_{m_{amp}}}, \tau_2 = R_{eq}C_i \cong \frac{C_i}{g_{m_{amp}}} \quad (12)$$

where $R_{eq}$ is the sum of the resistance of a switch and the output resistance of an epot. As the epot output resistance is dominant relative to the switch resistance, it may be assumed that the equivalent resistance is the epot output resistance. Moreover, the load capacitance that DAC amplifier sees from the output node can be expressed as:

$$C_{Load} = \frac{(C_i + C_f)(C_f + C_L) - C_f^2}{C_f} \quad (13)$$

where $C_L$ is the load capacitance introduced by the next stage. $C_{Load}$ may be valued close in value to $C_i$ for relatively small values of $C_L$. Therefore, these two $\tau$ values ($\tau_1$, $\tau_2$) can be equally effective in determining the step response of the system. Assuming that the system is overdamped, the step response of the system for t>0 can be expressed as:

$$V_{out}(t) = H_0\left(1 - \frac{1}{\tau_1 - \tau_2}\left(\tau_1 e^{\frac{-t}{\tau_1}} - \tau_2 e^{\frac{-t}{\tau_2}}\right)\right) \quad (14)$$

If the epot is biased such that $g_{m_{epot}} \gg g_{m_{amp}}$, then the amplifier of the DAC becomes the limiting factor in the calculation of the conversion time. Also, if the load capacitance $C_{load} \cong C_i$ is approximated, then it becomes easy to determine the conversion time. In order to assure an error free operation, the output voltage is preferably within 0.5 LSB of the final output voltage before the end of the conversion time. Then, extracting the conversion speed for the binary-weighted and equal capacitance FGDAC becomes possible. For this purpose, the worst case is considered for the binary weighted FGDAC, in which the selected $i^{th}$ bit is the MSB. Hence, the conversion speed may be expressed as:

$$T_{bwc} = 2^{(N-1)} \frac{C_{eqc}}{g_{m_{amp}}} (N+1) \ln 2 = 2^{(N-1)} T_{eqc} \quad (15)$$

The above expression (15) shows that as the resolution of the DAC increases, the conversion time for the binary weighted capacitance FGDAC increases as well. The equal capacitance FGDAC is not affected by the resolution of the DAC.

Figure 3:
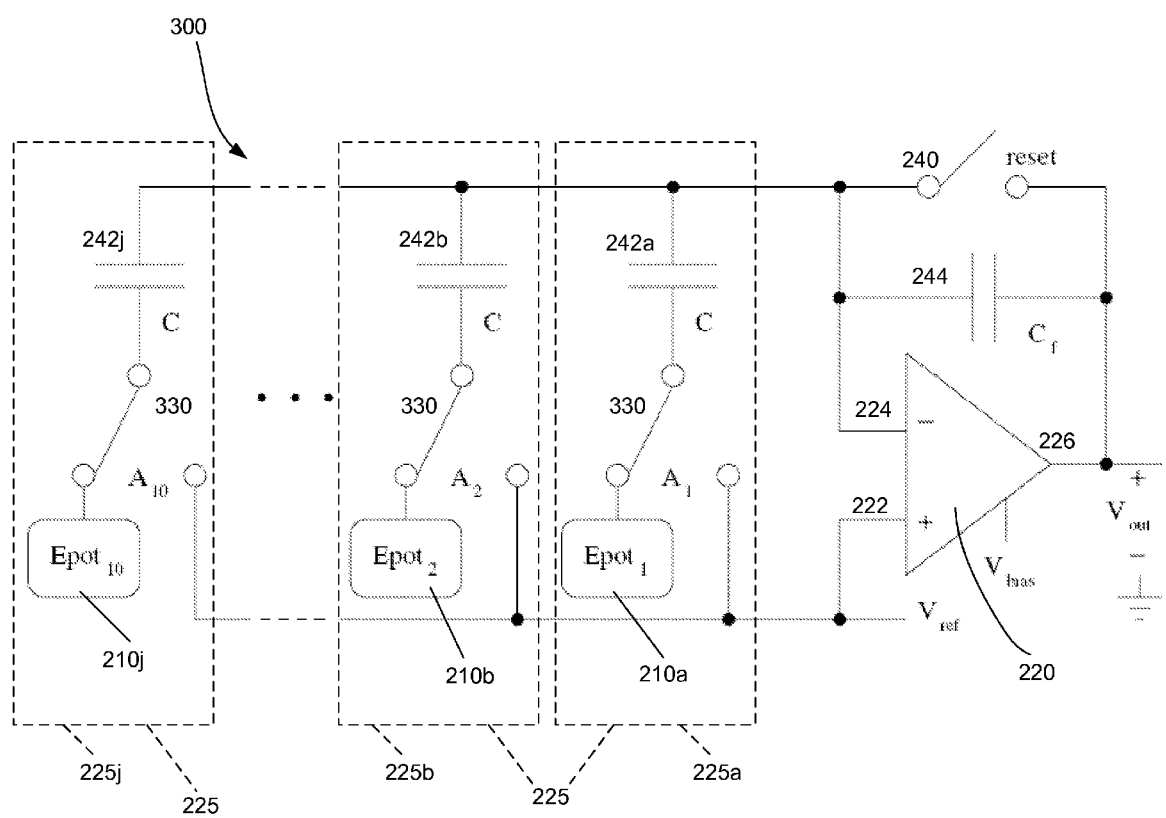
FIG. 3 is a schematic diagram illustrating another digital to analog converter, in accordance with an exemplary embodiment of the present invention.

Referring now to FIG. 3, a schematic diagram of a DAC circuit 300 is illustrated, in accordance with another exemplary embodiment of the present invention. The DAC 300 overcomes the deficiencies of the prior art by providing an epot 310 to drive each capacitor 242 in the ladder network of the DAC 300. Like circuit 200, the epot 310 enables the voltage input for each capacitor 242 in the ladder network 240 to be customized. Consequently, the implementation in circuit 300 with the epot 310, results in a smaller footprint design, and a lower power consumption circuit.

Also, in an exemplary embodiment, the circuit 300 may provide a compact and low-power ten-bit FGDAC. One skilled in the art will appreciate that the number of bits of resolution on the FGDAC is contingent on the number of capacitors of the ladder network. Nonvolatile floating-gate voltage references may be utilized to build a charge amplifier DAC architecture. Accordingly, this exemplary embodiment may limit, if not eliminate, large element spread and resolution trade-off in the traditional design of charge amplifier voltage-output DACs.

The circuit 300 may be preferably fabricated in a 0.5 µm CMOS process, wherein the total area is approximately 0.0522 mm². Data indicates that INL and DNL values less than ±0.5 LSB (0.68 mV) can be achieved. This improvement enables digital to analog conversion with programmable linearly, or nonlinearly spaced levels.

The epot 310 may be used to obtain a dynamically reprogrammable, non-volatile, on-chip voltage reference which can be easily integrated with traditional DAC architectures in standard CMOS processes. Hence, the epot 310 is a digitally programmable potentiometer, wherein a core of the epot 310 preferably includes a floating-gate transistor.

In the case of charge amplifiers 320, conventional designs require highly matched, scaled capacitor values, which often pose area/size concerns. A key element with respect to the size of these structures is the size of the binary-weighted capacitor array. Thus, reducing the size of the capacitor array may significantly improve the size characteristics of the DAC.

The circuit 300 of FIG. 3 may comprise several subsystems including, but not limited to, epots 310, an operational amplifier 320, and digital switches 330. The circuit 300 is designed to provide low-power and compact DACs that may be integrated with larger systems.

Even though the design of the FGDAC is slightly different than conventional DACs, it is still functionally the same. A digital input word controls the desired voltage output by switching the individual capacitors between the reference voltage ($V_{ref}$) and the corresponding epot output. This may result in a charge on the input side of the charge amplifier, which then amplifies the signal to produce a voltage output that may be expressed as:

$$V_{ref} - V_{out} = \frac{1}{C_f} \left( \sum_{i=1}^{n} a_i C_i (V_i - V_{ref}) \right) \quad (16)$$

where $V_{ref}$ is the reference voltage, $C_f$ is the feedback capacitor, $V_i$ is the epot output voltage, and $a_i$ is the digital input bit.

In this embodiment, equal sized input capacitors may be used together with a feedback capacitor. The feedback capacitor ($C_f$) has a value preferably approximately double the value of the input capacitor.

In an exemplary embodiment, the area used for an individual ladder network is summarized in Table I. A major contribution of area comes from the epots 310, which may be further reduced by eliminating additional digital selection and compensation circuitry. The compensation circuitry is utilized to minimize the effect of the digital selection circuit on the epot output voltage during programming. Compensation circuitry can be removed to reduce area, but, as a result, may complicate the controllability of the epot output.

TABLE I

AREA USED FOR FGDAC AND ITS COMPONENTS.

| Epots | Cap/switches | DAC w/o epots | DAC w/epots |
|---|---|---|---|
| 32,247 µm² | 8,867 µm² | 0.0199 mm² | 0.0522 mm² |

TABLE II

PROGRAMMED SPOT VOLTAGES (BUFFER OUTPUTS).

| Epot1 | Epot2 | Epot3 | Epot4 | Epot5 | Epot6 | Epot7 | Epot8 | Epot9 | Epot10 |
|---|---|---|---|---|---|---|---|---|---|
| 2.5948 V | 2.5966 V | 2.5997 V | 2.6162 V | 2.6296 V | 2.6718 V | 2.7860 V | 2.9340 V | 3.2698 V | 3.9393 V |

The input voltages provided by the epots 310 may be adjusted to obtain the results conventionally achieved through capacitor sizing. Exemplary input value are shown in Table II. Because capacitor size is not a constraint in this embodiment, for a given power consumption, the speed of the DACs may be maximized by reducing the capacitor area. In an exemplary embodiment, the unit capacitor value may be set to approximately 140 fF (femto-Farads).

Epots 310 can provide a user-friendly method of analog programming, and can be configured into a large array structure. Hot-electron injection and Fowler-Nordheim tunnelling may be used to adjust the output voltage by changing the charge on a floating node.

Figure 4:
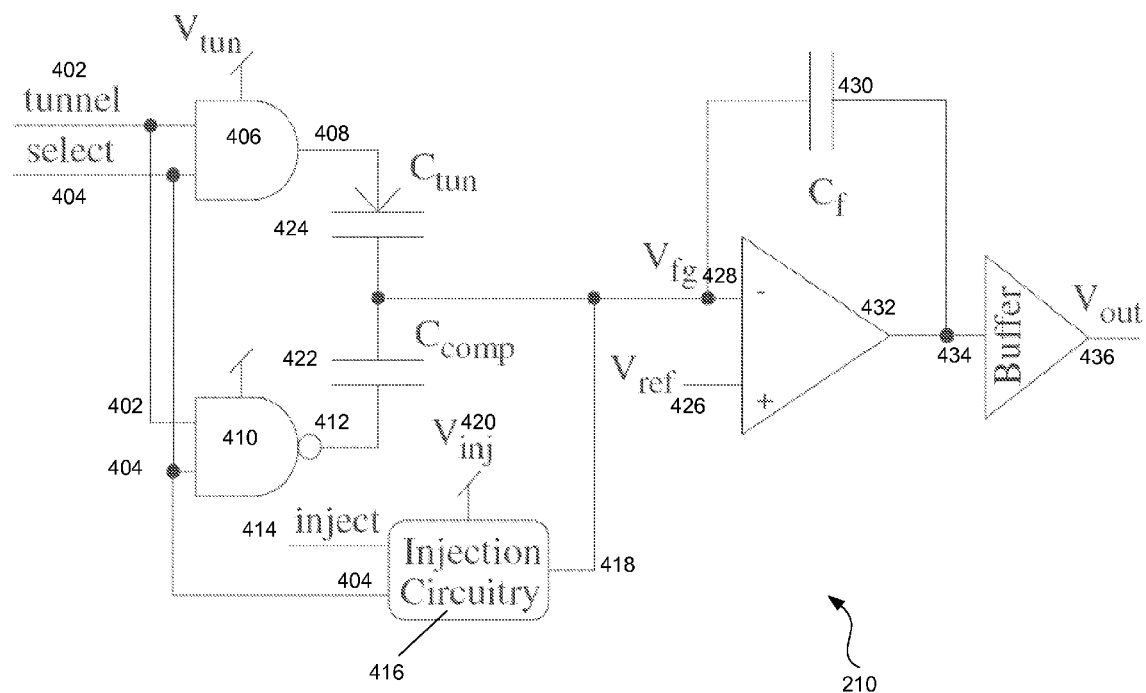
FIG. 4 is a schematic diagram of an electronic potentiometer, for use in an exemplary embodiment of the present invention.

A schematic diagram of the epot 310, in accordance with an exemplary embodiment of the present invention, is illustrated in FIG. 4. The programming of the epot 310 may be controlled via digital signals, which may enable the epot 310 to be adjusted to within approximately 100 µV of a target voltage. Also, analog values may be successfully retained by epots 310 for long-term operations.

Voltage references preferably have low noise, and epots 310 have been shown to be suitable for such low noise applications. For static measurements, flicker noise may be a concern. The epots 310 may exhibit approximately $$3.6 \frac{\mu V}{\sqrt{Hz}}$$

flicker noise. In addition, the thermal noise may be suppressed to operate at high speeds with high SNR (signal to noise ratio), and the epots 310 can exhibit approximately $$2.2 \frac{\mu V}{\sqrt{Hz}}$$

thermal noise.

Moreover, epots preferably drive large capacitive loads when integrated into the circuit 300. Therefore, the epot voltages may be buffered utilizing a two-transistor source follower with a current sink load. Depending on the power consumption requirement(s), the output resistance of the buffer can be tuned to allow operation at different speeds.

An exemplary output amplifier 320 of the FGDAC circuit 300 is a nine-transistor OTA (optical transconductance amplifier) operating in a subthreshold region. In this region, the amplifier 320 can yield high transconductance, bandwidth (BW), and gain for a given current level.

Figure 5:
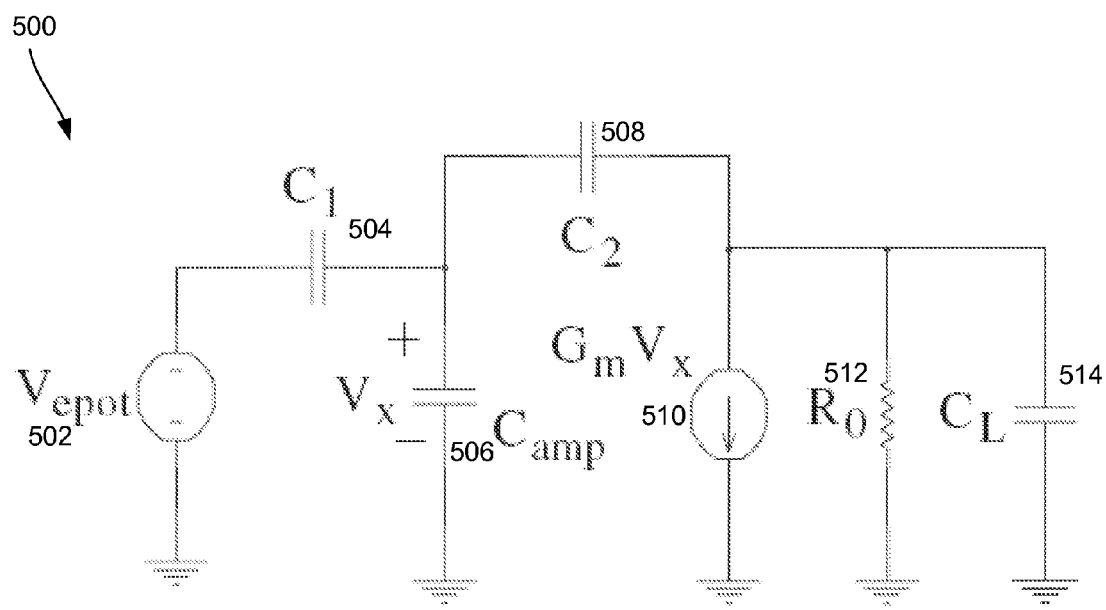
FIG. 5 is a schematic diagram of a one-bit circuit, in accordance with an exemplary embodiment of the present invention.

A time constant of the circuit 300 may be found by using the equivalent circuit 500 illustrated in FIG. 5 and can mathematically be shown as:

$$\tau_{FGDAC} = \frac{(C_L + C_2)(C_1 + C_{amp}) + C_L C_2}{G_m C_2} \quad (17)$$

In the embodiment shown in FIG. 5, $C_L$ 514 is preferably approximately 400 fF (femto-Farads) ($C_L$ has a small value, as FGDAC is buffered before driving the signal off-chip), and the bias current is set to approximately 6 µA (biased in the moderate inversion region), giving very high GB while consuming very low power, in the µW range.

In an exemplary embodiment, the epots may be programmed to obtain a full linear range of approximately 1.36 V, which can be increased by programming the epots to a different set of voltages. From the results of this transfer function, INL and DNL can be computed.

Results show that within this limited full-scale range, the circuit 300 of FIG. 3 may yield ten-bit linearity having less than 0.68 mV quantization error.

A limitation for higher linearity comes from the second-harmonic distortion of the output buffer used for driving signals off-chip; linearity of the buffers, however, often is not an issue. Also, flicker noise in the signal path is another limiting factor for static measurements. Therefore, amplifiers, as well as the epots, may be designed to exhibit low flicker noise. If the epots are designed to be smaller, the programming accuracy may become degraded. The effect of the charge at the floating node of the epot becomes higher, as the feedback capacitance becomes smaller. Therefore, this limitation can be improved by increasing Cf in the epot. In addition, electron traps may be created through the injection and tunnelling processes and change the charge at the floating node. This sets another limit for the operation, but again can be easily minimized by increasing the capacitance at the floating node.

Dynamic measurements of the FGDAC may be obtained by testing the performance of the DAC for sinusoidal and MSB (most significant bit) step inputs. Results indicate that the structure of the circuit 300 may be suitable for operating at high frequencies. Theoretically, the conversion speed of a traditional charge amplifier DAC design may be limited by the output amplifier. For improved performance and smaller area, the input and feedback capacitors of the FGDAC circuit 300 may be optimized, and therefore their effect on the speed may be effectively minimized. This architecture can be assumed to have two poles that are determined by the epots and the output amplifier. If the epot output is buffered before being supplied as an input, the primary pole comes from the amplifier.

For instance, first, a step input at 1.5 MHz may be applied to the MSB (most significant bit) of the FGDAC, because the large swing of this bit is a limiting factor for the speed of the FGDAC. The rise time of the step response is approximately 160 ns (nano-seconds), which is a known limitation of the output buffer. It is also known that other on-chip buffers and the test equipment may cause additional distortion, but the FGDAC exhibits promising performance over this range. Simulation results show settling times around 60 ns, which confirms that the output buffer is limiting the experimental performance. Second, applying a nine-bit sinusoidal input results in a seven-bit linear sinusoidal output. Again, a factor in the degradation of the linearity is the buffer, which may be minimized for on-chip system level implementations.

Figure 6:
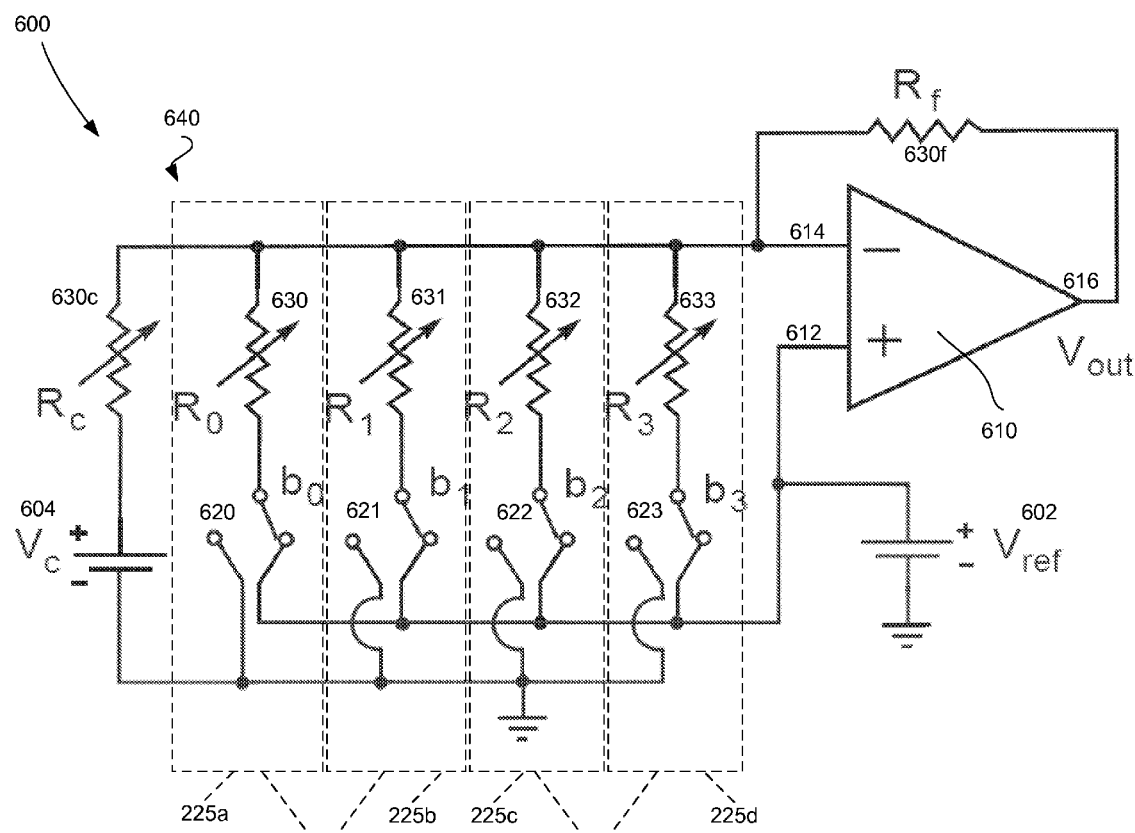
FIG. 6 is a schematic diagram illustrating a digital to analog converter having a tunable resistor ladder network, in accordance with an exemplary embodiment of the present invention.

FIG. 6 is a schematic diagram illustrating a DAC circuit 600 implemented using a plurality of tunable floating-gate resistors 630-633, in accordance with another exemplary embodiment of the present invention. The DAC illustrated in FIG. 6 overcomes the deficiencies of the prior art by providing a plurality of tunable resistors in a ladder network 640 to drive the charge amplifier 610. The incorporation of the tunable floating-gate resistors 630-633 enables the voltage for each ladder leg to be customized. The resulting solution has many of the same benefits as the embodiment illustrated in FIG. 2.

Resistors created in silicon generally take up a large amount of space. Decreasing the size of resistors in silicon must sacrifice accuracy. Due to size constraints, resistors further can not be programmed, as programming circuitry would only increase the amount of space consumed by the resistor.

By linearizing floating-gate transistors to create "resistors," resistor functionality can be provided with a smaller footprint. Furthermore, by providing tunable resistors in a DAC, each leg of an associated resistor ladder network may be customized to provide desired voltage feeds to a charge amplifier. Additionally, the creation of a tunable resistor element using floating-gate transistors creates vast opportunities for providing resistor functionality in a smaller package in CMOS.

Resistors are one of the most fundamental elements in analog very large scaled integration (VLSI) circuits, and frequently are incorporated into system-on-a-chip (SOC) to achieve different information processing. In standard CMOS technology, resistors are implemented by utilizing passive devices such as polysilicon, diffusion, or well strips. These resistors typically consume large chip areas to realize high resistance values, and further require laser trimming or other trimming techniques to achieve precise values. In contrast, programmable CMOS resistors in accordance with an exemplary embodiment of the present invention, can serve as an alternative to these resistors and enable dynamic, high, and precise resistance values. Thus, these CMOS resistors realize precise resistances while facilitating a reduction in system size and cost for the realization of precise resistors.

When operating a MOS (metal-oxide semiconductor) transistor as a tunable resistive element in the triode region, it is desirable to suppress nonlinearities of the transistor by applying a function of the input signal to its body and/or its gate. The second order effects of a MOS transistor operating as a resistor can also be modeled.

The second order effects of a MOS transistor can be identified as the fundamental quadric component due to the common-mode of the drain-to-source input voltage, the even ordered body effect, and the effective mobility degradation factor. These nonlinearities are mostly dependent on the common-mode voltage of the applied input signal and may be minimized by building common-mode feedback structures around a transistor.

Tunable CMOS resistors can offer design flexibility in building precision and compact analog circuits. Therefore, tunable resistors are widely used in transconductance multipliers, highly linear amplifiers, tunable MOSFET-C filters, and the like. Additionally, the tunable CMOS resistors may achieve high and precise resistance values through the utilization of controllable MOS channel resistance.

Depending upon the chosen application, the tunable CMOS resistors are generally designed to have a highly linearity, area/power efficiency, and a wide tuning/operating range. While the linearity and operating range are typically featured for highly linear applications that require a high signal-to-noise and distortion ratio, the compactness, power consumption and tuning range are often concerns for ANN systems (Artificial Neural Network). The power consumption and tuning range can be determined by an architecture adopted to implement a tunable resistor. In addition, a targeted operational frequency affects the total power consumption of the circuit. Furthermore, a trade off between the area and linearity of the tunable CMOS resistors due to matching between the critical devices can determine the compactness of the design.

ANN systems and other low-power and low-voltage applications usually require a design of a compact and tunable resistor that is less sensitive to mismatches, but is also suitable for the operation at low supply voltages. Moreover, these applications may achieve the required linearity and tuning range with low power consumption. The CMOS resistor may employ a floating-gate MOS transistor operating in the triode region, and can further utilize a scaled-gate linearization technique to decrease its nonlinearities. In this resistor structure, a floating-gate transistor can be used to scale the input signals through its input capacitors and to store the charge at its floating-gate terminal to control its resistance.

In a standard CMOS technology, a linearized tunable CMOS resistor can be designed by employing a linearization technique. Such techniques exploit MOSFET's square-law characteristic in the saturation region, or its resistive nature in the triode region. While the transistor operates in the triode region, the common-mode, gate, and scaled-gate linearization techniques can be utilized to suppress the nonlinearities of a MOS transistor and to design a tunable CMOS resistor.

In contrast to other techniques, the common-mode strategy offers a high linearity, but its implementation requires the use of a higher voltage than the supply voltage and increased resistor area to generate the well-feedback voltage. If high linearity is traded with a simplified design to suppress the fundamental quadratic component of transistor nonlinearity, then the gate linearization technique can be utilized to build a compact tunable resistor. Alternatively, the scaled-gate linearization technique can be adopted to a single MOS transistor in the triode region to alleviate the area and linearity issues of the tunable CMOS resistors.

In order to analyze the scaled-gate linearization scheme, which is often realized by applying a scaled common-mode voltage to the gate terminal, the drain current of an nFET transistor in the strong inversion is expressed as:

$$I_d = \frac{\mu C_{ox} W}{L}[f(v_g, v_d, v_s) - g(v_b, v_d, v_s)] \quad (18)$$

where $\mu$ is the carrier mobility, $C_{ox}$ is the gate capacitance per unit area, W is the channel width, L is the channel length, and $v_g$, $v_d$, $v_s$, and $v_b$ are the gate, drain, source, body voltages (referenced to the ground), respectively. Similar to the drain current, the carrier mobility is also dependent on the terminal voltages and can be expressed in terms of f and g as:

$$\mu = \frac{\mu_o}{1 + \frac{\theta}{v_{ds}}[f(v_g, v_d, v_s) - g(v_b, v_d, v_s)]} \quad (19)$$

where $\theta$ is the mobility degradation factor, and f and g can be written as:

$$f(v_g, v_d, v_s) = [v_g - V_{FB} - \phi]v_{ds} - v_{ds}v_c \quad (20)$$

$$g(v_b, v_d, v_s) = \frac{2\gamma}{3}[(v_d - v_b + \phi)^{3/2} - (v_s - v_b + \phi)^{3/2}] \quad (21)$$

where $v_c$ is the common-mode voltage and equal to $(v_d+v_s)/2$, $V_{FB}$ is the flat-band voltage, $\phi$ is the surface potential, and $\gamma$ is the body-effect coefficient. If a body potential, $v_b$, is fixed at some bias potential, $V_B$, then the fundamental quadratic component, $v_{ds}v_c$, and the body effect can be cancelled by applying a scaled common-mode voltage to the gate terminal. This is achieved by choosing the scale factor as:

$$a = 1 + \frac{\gamma}{2\sqrt{(V_B + \phi)}} \quad (22)$$

For a fixed body potential, $V_B$, a becomes a process dependent parameter. While the variation in process parameters becomes a limiting factor for this technique, this can be overcome by tuning $V_B$. After applying this technique, the first order mobility dependence of the transistor dominates the distortion, and the drain current can be approximated as $$I_d = \frac{\mu'_o C_{ox} W}{L} \left\{ [V_G - V_T]v_{ds} - \frac{\theta'\gamma[V_G - V_T](v_{ds}v_c)}{\sqrt{(V_B + \phi)}} \right\} \quad (23)$$

where $V_G$ is the quiescent gate voltage, and $\mu'_o$ and $\theta'$ are $$\mu'_o = \frac{\mu_o}{1 + \theta[V_G - V_{FB} - \phi + \gamma\sqrt{(V_B + \phi)}]} \quad (24)$$

$$\theta' = \frac{\theta}{1 + \theta[V_G - V_{FB} - \phi + \gamma\sqrt{(V_B + \phi)}]} \quad (25)$$

This technique may be used to limit, if not eliminate, the fundamental quadratic term, and the body effect term. The input voltage range of this technique is determined by the triode condition, which is $$V_{ds} < \frac{2}{(2-a)}(V_G - V_T - (1-a)V_s) \text{ for } V_g = V_G + \frac{a(V_d + V_s)}{2}.$$

Therefore, this technique requires the design of a scale factor to minimize the nonlinearities, and the generation of a large $V_G$ to ensure the triode operation for given operating range.

Still referring to FIG. 6, resistors $R_i$ 630-633 are tunable resistors, wherein i=0, 1, 2, 3. Resistor $R_f$ 630f is the feedback resistor, and resistor $R_c$ 630c can be used to obtain the full output voltage range and to tune the offset of the DAC. Voltage $V_c$ 604 may be used to set a supply rail of the DAC.

Variable resistors can be used, in the binary-weighted DAC, to obtain scaled currents and a full output voltage swing at the DAC output. The input resistors 630-633 can switch between ground and voltage reference $V_{ref}$ 602 to generate the scaled currents. Further, $V_c$ 604 and $R_c$ 630c may be used to obtain a larger output voltage range by creating an offset current. In addition, due to tunability of these resistors, $R_c$ 630c enables tuning of the offset of the DAC.

In cases where accuracy is a design objective, highly matched passive resistors may be used to prevent degradation of DAC linearity. This requirement, however, necessitates the use of large devices, which may be expensive in terms of area and can degrade the high frequency performance. Instead of passive devices, tunable resistors may be used to alleviate matching and area requirements.

This structure may be immune to resistor non-linearity, as the voltage across the resistors can assume two values. Due to the limited low frequency voltage gain of the amplifier, however, the voltage across the resistors can still vary by the error voltage, $e = V_o/A_o$, where $V_o$ is the output voltage swing, and $A_o$ is the low frequency voltage gain of the amplifier. When tunable resistors are incorporated into such a design, the nonlinearities of these resistors have to be suppressed to obtain a better DAC linearity.

In the scaled-gate linearization technique area (i.e., size) and linearity issues of the tunable CMOS resistors may be allocated. The scaled-gate linearization scheme can be implemented by applying a scaled common-mode voltage to the gate terminal. For a fixed body potential, $V_B$, the fundamental quadratic effect of the drain and source voltages and the body effect can be cancelled by applying a scaled common-mode voltage to the gate terminal. This can be achieved by choosing the scale factors as $\lambda = 1 + \gamma/(2\sqrt{(V_B + \phi)})$, where $\gamma$ is the body-effect coefficient and $\phi$ is the surface potential. After applying this technique, the first order mobility dependence of the transistor can dominate the distortion, and the drain current can be approximated as:

$$I_d = \frac{\mu'_n C_{ox} W}{L}[V_G - V_T]v_{ds}\left\{ 1 - \frac{\theta'\gamma v_c}{\sqrt{(V_B + \phi)}} \right\} \quad (26)$$

where $C_{ox}$ is the gate capacitance per unit area, W is the channel width, L is the channel length, $V_G$ is the quiescent gate voltage, $v_{ds}$ is the drain-to-source voltage, $v_c$ is the common-mode voltage, $(v_d + v_s)/2$. Also, $V_T = V_{FB} + \phi + \gamma\sqrt{V_B + \phi}$, $\mu'_n = \mu_n/(1 + \theta[V_G - V_{FB} - \phi + \gamma\sqrt{(V_B + \phi)}])$, and $\theta' = \theta/(1 + [V_G - V_{FB} - \phi + \gamma\sqrt{(V_B + \phi)}])$ where $V_{FB}$ is the flat-band voltage and $\phi$ is the mobility degradation factor. Therefore, this embodiment can provide a design having a scale factor to minimize the nonlinearities, and the generation of a large $V_G$ to ensure the triode operation for given operating range. Further, this embodiment may decrease the footprint of DACs.

Figure 7:
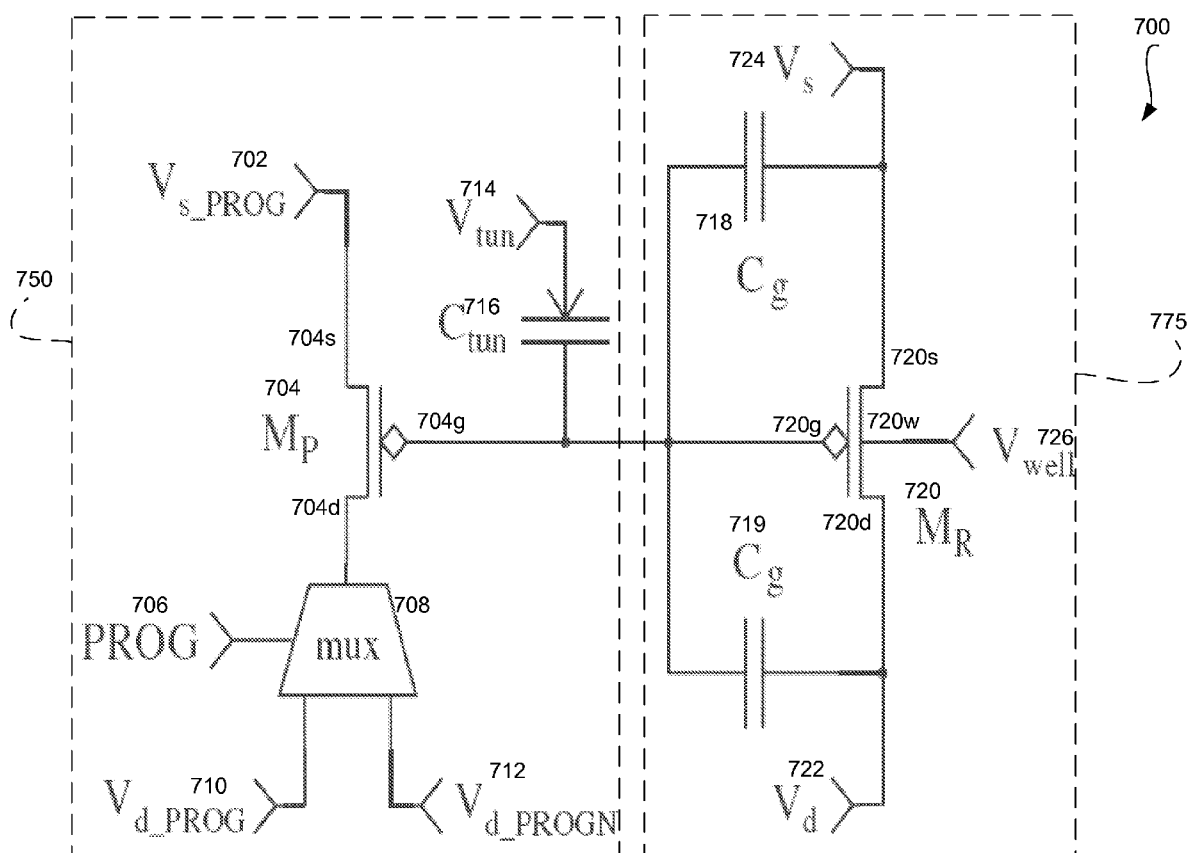
FIG. 7 is a schematic diagram illustrating a programmable floating gate resistor, in accordance with an exemplary embodiment of the present invention.
Figure 8:
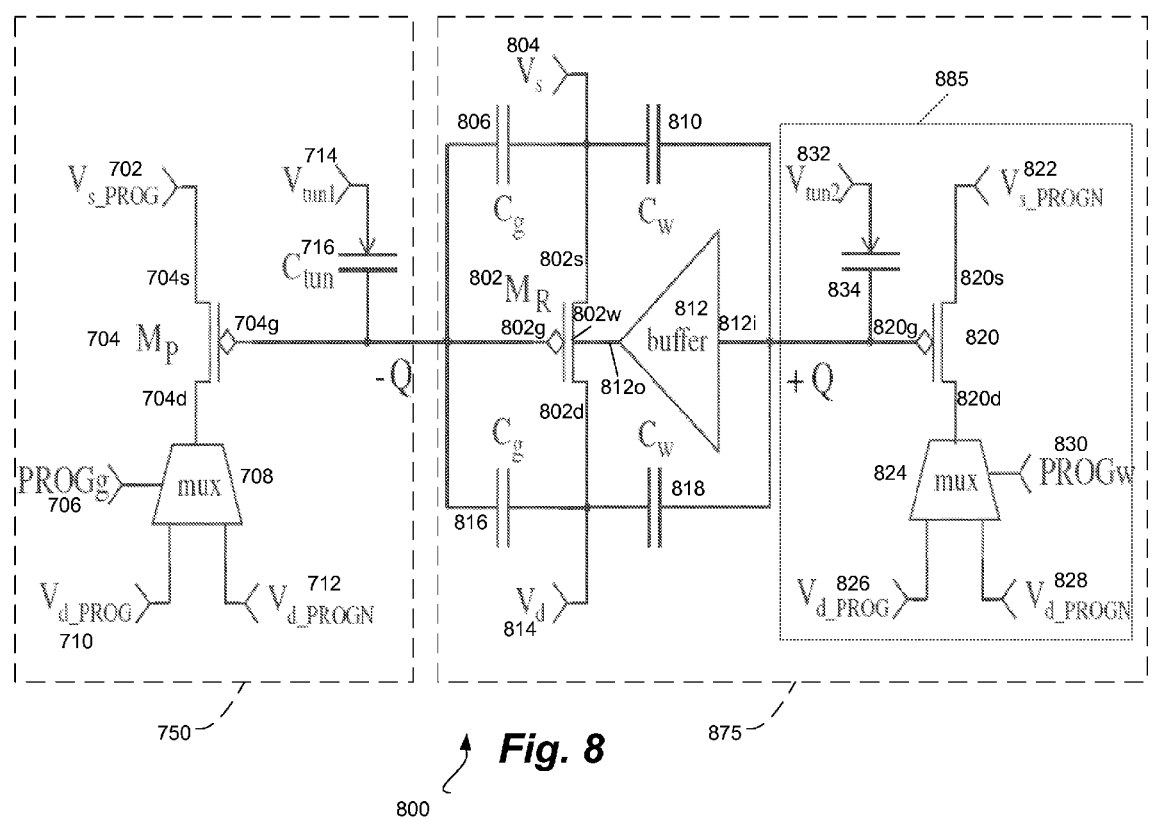
FIG. 8 is a schematic diagram illustrating another programmable floating-gate resistor with improved linearity, in accordance with an exemplary embodiment of the present invention.
Figure 9:
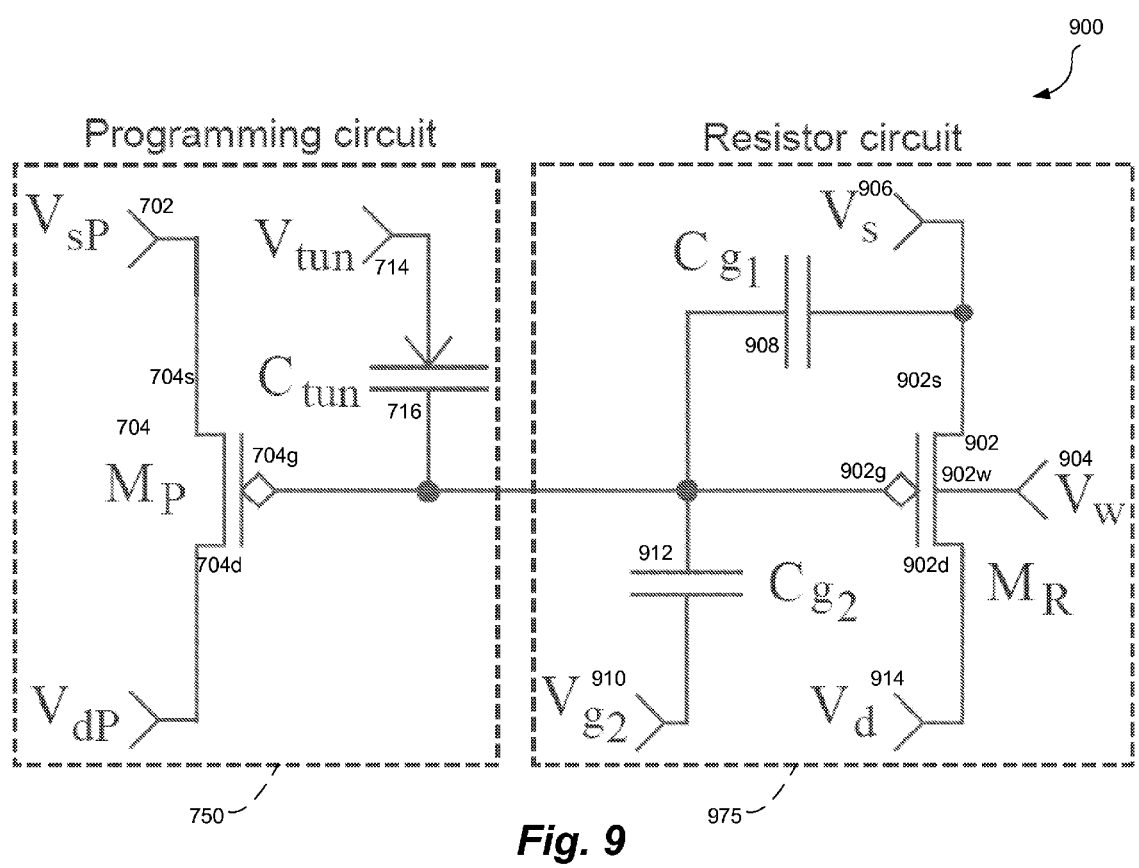
FIG. 9 is a schematic diagram illustrating another programmable floating-gate resistor, in accordance with an exemplary embodiment of the present invention.
Figure 10:
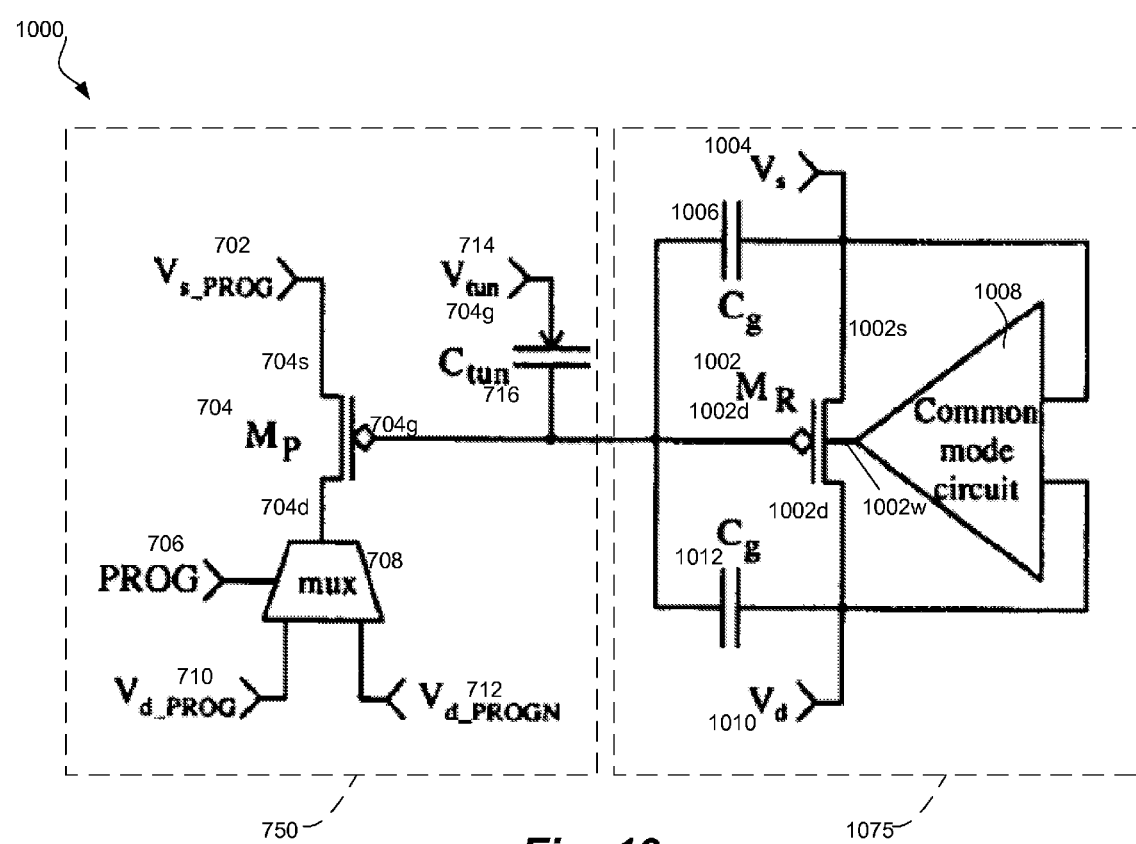
FIG. 10 is a schematic diagram illustrating an additional floating-gate resistor, in accordance with an exemplary embodiment of the present invention.
Figure 11:
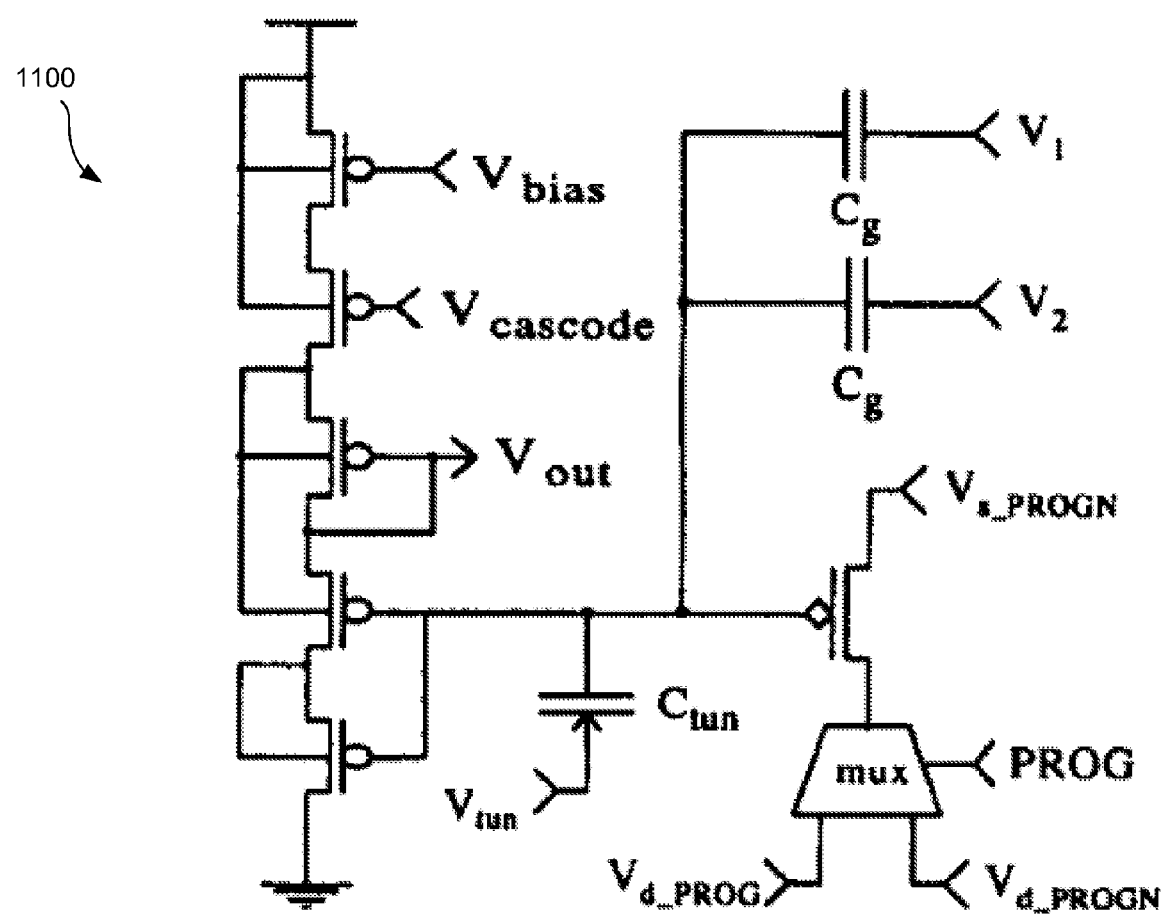
FIG. 11 is a schematic diagram illustrating another floating-gate resistor, in accordance with an exemplary embodiment of the present invention.

FIGS. 7-10 are schematic diagrams of floating-gate resistors (FGRs), in accordance with exemplary embodiments of the present invention. FIGS. 8 and 10 are substantially similar, with FIG. 8 illustrating a more expanded view of the floating-gate resistor. FIG. 11 is a schematic diagram of a common mode circuit, as shown in FIG. 10.

Each floating-gate resistor of FIGS. 7-10 includes a programming circuit 750 and a resistor circuit. The programming circuit 750 for each floating-gate resistor is substantially the same. The resistor circuits, however, for each floating-gate design is different, thereby providing alternative embodiments having various linearized resistor characteristics.

As shown in FIG. 7, the programming circuit 750 includes a programming transistor $M_P$ 704. The programming transistor $M_P$ 704 is preferably a floating-gate transistor. The source 704s of the programming transistor $M_P$ 704 may be fed a voltage $V_{s\_PROG}$ 702. The drain 704d of the programming transistor $M_P$ 704 is coupled to a multiplexer (mux) 708, adapted to select between two or more programming voltage signals, i.e., $V_{d\_PROG}$ 710 and $V_{d\_PROGN}$ 712. Alternatively, the mux 708 may be omitted and the drain 704d may be driven directly by a programming signal. The programming signal may be selected using a programming selection signal, PROG 706. The gate 704g of the transistor 704 of the programming circuit 750 is in communication with a tunneling voltage $V_{tun}$ 714, through a tunneling capacitor $C_{tun}$ 716. Notably, the gate 704g is a floating-gate and therefore is isolated.

Additionally, the circuit 700 in FIG. 7 includes a resistor circuit 775 for operation with the programming circuit 750. This resistor circuit 775 operates as a programmable resistor, and does not consume additional power for the common-mode computation.

The resistor circuit 775 of FIG. 7 is coupled to the floating-gate in the programming circuit 750. The resistor circuit 775 includes a transistor $M_R$ 720. Like the programming transistor $M_P$ 704, the transistor $M_R$ 720 of the resistor circuit 775 is preferably a floating-gate transistor, and its gate 720g is coupled to the floating gate 704g of the programming transistor M$_P$ 704. A well 720w of the transistor M$_R$ 720 is fed with a well voltage V$_{well}$ 726. The source 720s of the transistor M$_R$ 720 is fed with a voltage source V$_s$ 724, and is coupled to the gate 720g via a gate capacitor 718. Also, the drain 720d of the transistor 720 is fed a drain voltage V$_d$ 722, and is coupled to the gate 720g via another gate capacitor 719.

As stated above, the gate 720g of the transistor 720 of the resistor circuit 775 is coupled to the gate 704g of the transistor 704 of the programming circuit 750. This coupling allows the gate charge on the programming resistor to determine the gate charge of the transistor M$_R$ 720. Thus, indirect programming of the transistor M$_R$ 720 may be achieved.

The circuit 700 can be designed to obtain a common-mode voltage applied to the gate 720g, and to acquire the quiescent gate voltage while keeping the well 720w at a fixed potential. The common-mode voltage can be computed by using the gate capacitors (C$_g$), acting as feedback capacitors, which can couple the drain voltage V$_d$ 722 and source voltage V$_s$ 724 to the gate 720g. In addition, the charge stored at the gate 720g creates the required quiescent gate voltage. As a result, the gate voltage referenced to the well can be expressed as:

$$V_{wg} = \frac{C_g(V_s + V_d) + Q}{2C_g + C_{M_R} + C_{M_P} + C_{tun}} \quad (27)$$

where C$_{M_R}$ and C$_{M_P}$ are the oxide and overlap capacitance M$_R$ and M$_P$, respectively. Also, C$_{tun}$ is the tunnelling junction capacitance, and M$_P$ is the injection transistor. In order to obtain the required common-mode voltage at the gate 720g, C$_g$ should be larger than C$_{M_R}$, C$_{M_P}$ and C$_{tun}$ so that the well-gate potential is close to:

$$V_{wg} \cong \frac{(V_s + V_d)}{2} + V_{offset} \quad (28)$$

where V$_{offset}$ is the effect of the charge stored at the gate terminal.

In contrast to the floating-gate implementations of the gate linearization and common-mode linearization techniques, one of the input terminals of the FGR can be maintained at a fixed potential, or at AC ground. Use of a floating-gate transistor in this structure enables obtaining the scale factor and large gate voltages due to its capacitive coupling and charge storage capabilities.

The scale factor, a, may be obtained by sizing the transistors and capacitors connected to the floating-gate terminal. Since the common-mode voltage and the scale factor in this structure are computed at the same time, the scale factor for this implementation can he redefined as $\chi$=a/2. With this implementation, $\chi$ can be expressed as:

$$\chi = \frac{C_{g1}}{C_{g1} + C_{g2} + C_P + C_{MR}} \quad (29)$$

where C$_{g1}$ and C$_{g2}$ are the gate feedback capacitor and the trimming capacitor; C$_P$ and C$_{MR}$ are the parasitic capacitance of the peripheral circuit and input capacitance of M$_R$, respectively. C$_{MR}$ consists of the gate-to-drain capacitor (C$_{gd}$), gate-to-source capacitor (C$_{gs}$) and gate-to-well capacitor (C$_{gw}$). In triode region, C$_{gs}$=$\alpha$C$_{ds}$, where $\alpha$=1-V$_{ds}$(1+$\delta$)/(V$_{gs}$-V$_T$) and $\delta$=$\gamma$/(2$\sqrt{\phi_B+V_{sb}}$). As a part of C$_{MR}$ contributes to C$_{g1}$, this effect can be taken into account when designing the circuit with large transistors.

A charge on the floating-gate terminal can be tuned by employing an indirect programming scheme. In this scheme, a tunnelling junction capacitor and an additional PMOS transistor may be used to tune the charge on the floating-gate terminal without introducing additional switches in the signal path. The resistance of the FGR (floating-gate resistor) is tuned by utilizing the Fowler-Nordheim tunnelling and hot-electron injection quantum mechanical phenomena. V$_{tun}$ may be used to enable the tunnelling mechanism to decrease the number of electrons. V$_{sPROG}$ and V$_{dPROG}$ may be used to create a desired voltage difference for the hot-electron injection mechanism to occur to increase the number of electrons on the floating-gate terminal.

In addition to the programming circuit 750, the resistor circuit 775 comprising at least one transistor Mr 720, and two gate capacitors 718 and 719, resulting in a compact circuit 700. The scale factor chosen can minimize nonlinearities. There is no specific matching, however, between the devices. Therefore, the total area may be optimized for the given application. Furthermore, since the computation can be achieved by utilizing the capacitive coupling and charge storage capabilities of the floating-gate transistors, no additional power consumption is needed. Hence, this feature may be useful for low-power applications.

FIG. 8 is a schematic diagram illustrating a programmable floating-gate resistor having floating gate transistor well capabilities. As shown in FIG. 8, circuit 800 comprises the programming circuit 750 and a resistor circuit 875. The resistor circuit 875 is coupled to the floating-gate of the programming circuit 750. The resistor circuit 875 includes a transistor M$_R$ 802. Preferably, the transistor M$_R$ 802 is a floating-gate transistor. The floating gate 802g of the transistor M$_R$ 802 is coupled to the floating-gate 704g of the programming circuit 750. The source 802s is fed with a source voltage V$_s$ 804, and is coupled to the floating gate 802g of the transistor M$_R$ 802, through a gate capacitor C$_g$ 806. Additionally, the source 802s of transistor M$_R$ 802 is coupled to the input of buffer 812 through a well capacitor 810. The drain 802d is connected to a drain voltage Vd 814, and is coupled to the floating gate 802g of transistor M$_R$ 820 through a second gate capacitor 816. Additionally, the drain 802d is coupled to the input of the buffer 812 through a second well capacitor 818.

The resistor circuit 875 also includes a programmable well circuit 885, connected to the input 812i. The programmable well circuit 885 includes a programming transistor 820, which is preferably a floating-gate transistor. The source 820s of the programming transistor 820 may be fed an input signal V$_{s\_PROGN}$ 822. The drain 820d of the programming transistor 820 is coupled to a multiplexer (mux) 824, adapted to select between two or more programming voltage signals, i.e., V$_{d\_PROG}$ 826 and V$_{d\_PROGN}$ 828, using a selection signal PROGw. Alternatively, the mux 824 may be omitted and the drain 820d may be driven directly by a programming signal. The gate 820g of the transistor 820 of the programming well circuit 885 is coupled to a tunneling voltage V$_{tun2}$ 832, through a tunneling capacitor 834. Notably, the gate 820g is a floating-gate and therefore is isolated. The gate 820g is coupled to the input 812i of the buffer 812. An output 812o of the buffer 812 is fed into the well 802w of the transistor M$_R$ 802.

Circuit 800 of FIG. 8 provides improved results in terms of linearity, as compared to circuit 700. Feedback capacitors (C$_w$) in the circuit 800 may be used to compute the common-mode voltage. Indeed, the circuit 800 utilizes a feedback voltage applied to the well 802w to further reduce the inherent nonlinearilies of a MOS transistor. ±Q can be used to express the programmed charges at the gate terminals.

MOS transistors have a symmetric nature that makes it possible to linearize channel resistance. Therefore, the drain-to-source current of a MOS transistor can be expressed in terms of its terminal current and may be approximated as voltages symmetrically. A drain current of an n-type MOSFET in the strong inversion can be expressed as:

$$I_d = \frac{\mu_o C_{ox} W}{L} \left\{ \frac{[f(v_g, v_d, v_s) - g(v_b, v_d, v_s)]}{1 + \frac{\theta}{(v_d - v_s)}[f(v_g, v_d, v_s) - g(v_b, v_d, v_s)]} \right\} \quad (30)$$

where $\mu_o$ is the carrier mobility, $C_{ox}$ is the gate capacitance per unit area, W is the channel width, L is the channel length, $\theta$ is the mobility degradation factor, and $v_g$, $v_d$, $v_s$, and $v_b$ are the gate, drain, source, body voltages (referenced to the ground), respectively. Also, the functions f and g can be written as:

$$f(v_g, v_d, v_s) = [v_g - V_{FB} - \phi](v_d - v_s) - \frac{1}{2}(v_d^2 - v_s^2) \quad (31)$$

$$g(v_b, v_d, v_s) = \frac{2\gamma}{3}[(v_d - v_b + \phi)^{3/2} - (v_s - v_b + \phi)^{3/2}] \quad (32)$$

where $V_{FB}$ is the flat-band voltage, $\phi$ is the surface potential, and $\gamma$ is the body-effect coefficient. It can be shown that the body-effect and mobility degradation both depend on the common mode voltage, $v_c = (v_d + v_s)/2$. Therefore, the linearity of a single transistor can be greatly improved by applying the common mode signal with the addition of corresponding quiescent voltage to the gate and body terminals, and these voltages can be expressed as:

$$v_g = V_G + \frac{v_d + v_s}{2} \text{ and } v_b = -V_B + \frac{v_d + v_s}{2} \quad (21)$$

If $\theta'$ is defined as:

$$\theta' = \frac{\theta}{1 + \theta[V_G - V_{FB} - \phi + \gamma\sqrt{(V_B + \phi)}]} \quad (33)$$

then it is known that for $\theta' \ll 1$, the drain current can be approximated as:

$$I_d = \frac{\mu' C_{ox} W}{L} \left\{ [V_G - V_T](v_d - v_s) + \frac{\gamma(1 + \theta'[V_G - V_T])}{96\sqrt[3]{V_B + \phi}}(v_d - v_s)^3 \right\} \quad (34)$$

where:

$$V_T = V_{FB} + \phi + \gamma\sqrt{V_B + \phi} \quad (35)$$

-continued $$\mu'_o = \frac{\mu_o}{1 + \theta[V_G - V_{FB} - \phi + \gamma\sqrt{V_B + \phi}]} \quad (36)$$

The result shown in equation (36) may be considered significant, because the inherent nonlinearities of a MOS transistor can be reduced down to a cubic ordered term. With a reasonable selection of gate and bulk overdrive voltages, the linear region of a MOS transistor can be greatly extended.

While this linearization technique is appealing in terms of the reduced harmonic distortion, building feedback structures to generate a common-mode voltage generally results in an increased number of components and thus increased power consumption. In addition, creating large overdrive voltages with fully integrated circuits using conventional processes is not a trivial task. These disadvantages limit the operation of a linearized MOS transistor and, therefore, the conventional approach has been to look for alternative linearization techniques. The introduction of floating-gate MOS transistors can effectively solve these problems by providing capacitively coupled gate connection, and an overdrive voltage that can be adjusted by using the hot-electron injection and Fowler-Nordheim tunnelling mechanisms.

The nonlinearities may be reduced down to cubic ordered distortion levels as shown in equation (36). With this structure operating in low frequencies, it is possible to keep C$_g$ large compared to the oxide and overlap capacitances of the transistors to keep the distortion in cubic ordered level. If the resistor circuit illustrated in FIG. 8, however, is designed to operate in high frequencies where any capacitive loading at the input terminals becomes a concern, then input terminals preferably are buffered, or alternatively C$_g$ should be reduced. If C$_g$ is reduced, an error term, $\epsilon$, is introduced to (25) to represent the scaling error of the common mode voltage, $$I_d = \frac{\mu' C_{ox} W}{L} \left\{ \begin{array}{c} [V_G - V_T](v_d - v_s) - \frac{\varepsilon}{2}(v_d^2 - v_s^2) + \\ \frac{\gamma(1 + \theta'[V_G - V_T])}{96\sqrt[3]{V_B + \phi}}(v_d - v_s)^3 \end{array} \right\} \quad (37)$$

Linearity of the device may degrade due to corresponding increase in the threshold voltage. The linearity can improve for decreased resistance values as increasing the gate over-drive voltage also reduces the relative effect of the nonlinearities caused by the fixed well potential. Therefore, the well terminal of the device may be modulated with a common-mode signal. For low gate overdrive voltages, the linear range is small and the nonlinearities dominate the behavior of the floating-gate resistors. By employing the well feedback, however, and a high gate overdrive voltage the change in the resistance from can be kept less than 1 percent for the input voltages changing from –5V to 5V.

Another exemplary floating-gate resistor embodiment is illustrated in FIG. 9. As shown in FIG. 9, circuit 900 includes a programming circuit 750 and a resistor circuit 975. FIG. 9 is a preferred schematic diagram for the DAC, wherein a tunable floating gate resistor is implemented in the DAC.

The resistor circuit 975 of circuit 900 is coupled to the floating-gate of the programming circuit 750. The resistor circuit 975 includes a transistor $M_R$ 902, which is preferably a floating-gate transistor. The gate 902g of the transistor $M_R$ 902 is coupled to the floating-gate 704g of the programming circuit 750. The well 902w may be fed with a well voltage $V_w$ 904. The source 902s of the transistor $M_R$ 902 is connected to a source voltage $V_s$ 906, and is coupled to the gate 902g via a gate capacitor $C_{g1}$ 908. A gate voltage $V_{g2}$ 910 may be fed to the gate 902g via a second gate capacitor $C_{g2}$ 912. The drain 902d of the transistor $M_R$ 902 is connected to a drain voltage $V_d$ 914.

As described, the gate 902g of the transistor $M_R$ 902 of the resistor circuit 975 is coupled to the gate 704g of the transistor 704 of the programming circuit 750. This coupling enables the gate charge on the programming circuit 750 to determine the gate charge of the transistor $M_R$ 902. Hence, indirect programming of the transistor $M_R$ 902 may be achieved.

Preferably, one input terminal of the resistor may be maintained at a fixed potential. A scale factor may be chosen to minimize nonlinearities. In this embodiment, $C_g$ and the input capacitance of $M_R$ are used to obtain the scale factor.

Accordingly, $V_R$ 906, and $V_d$ 914 are the source and drain voltages of $M_R$, respectively. Gate capacitor $C_{g1}$ 908 is the feedback capacitor used for linearization, and gate capacitor $C_{g2}$ 912 is the trimming capacitor. A charge on the floating gate is programmed by using the tunneling junction, tunneling capacitor $C_{tun}$ 716 is connected to $V_{tun}$ 714 and the injection transistor $M_P$ 704. $V_{sP}$ 702 and $V_{dP}$ are the source and drain voltages of transistor $M_P$ 704, respectively. In addition, gate voltage $V_{g2}$ 910 allows for tuning of the resistance. In this exemplary embodiment, source voltage $V_s$ 906 may be used as the input terminal, and drain voltage $V_d$ 914 is fixed to a bias potential.

A scale factor, λ, can size the transistors and capacitors connected to the floating-gate terminal. In this embodiment, a common-mode voltage and the scale factor are computed at the same time, thus the scale factor can be redefined as χ=λ/2, which can be expressed in terms of circuit parameters as $$\chi = \frac{C_{g1} + C_{gs}}{C_{g1} + C_{g2} + C_P + C_{M_R}}.$$

In this equation, $C_{g1}$ and $C_{g2}$ are the gate feedback capacitor and the trimming capacitor; $C_P$, and $C_{MR}$ are the parasitic capacitance of the peripheral circuit and input capacitance of $M_R$ respectively. $C_{MR}$ consists of the gate-to-drain capacitor ($C_{gd}$) gate-to-source capacitor ($C_{gs}$) and gate-to-well capacitor ($C_{gw}$). As $C_{gs}$ can contribute to $C_{g1}$, this effect may be taken into account when designing the circuit with large transistors. Moreover, the charge on the floating gate terminal, and thereby the resistance of the FGR, may be tuned by utilizing the Fowler-Nordheim tunnelling and hot-electron injection quantum mechanical phenomena. This can be achieved by using a tunnelling junction capacitor and an additional pMOS transistor. For example, $V_{tun}$ may be set to 14V, enabling the tunnelling mechanism to decrease the amount of electrons. $V_{sP}$ and $V_{dP}$ may be used to create the required voltage difference (from 5.5V to 8V) for the hot-electron injection mechanism to occur, thereby increasing the amount of electrons on the floating-gate terminal. In addition, $V_{g2}$ may be used to tune the resistance of the FGR. When FGR stays in the triode region, $V_{g2}$ can alter the transconductance of the FGR linearly since it has a linear relation with the effective gate voltage.

A temperature dependence of the FGR can be found by ignoring the higher order terms in (37) and rearranging it as $1/R=(\mu'_n C_{ox} W/L)[V_G-V_T]$. The temperature dependence of $\mu'_n$ and $V_T$ in this equation can expressed as $\mu'_n=\mu'_{n_o}(T/T_0)^{-m}$ and $V_T=V_{T_0}-\alpha_{VT}(T-T_0)$ where $T_0$ is the reference temperature, and m is the positive constant that ranges from 1.5 to 2, and $\mu'_n$ and $V_{T_0}$ are the temperature independent parameters. Also, $\alpha_{VT}$ is in the range of 0.5 to 4 mV/° C. Hence, the temperature coefficient of the FGR can be expressed as $$\frac{1}{R}\frac{\delta R}{\delta T} = -\frac{1}{\mu_n}\frac{\delta \mu'_n}{\delta T} + \frac{1}{V_G - V_T}\frac{\delta V_T}{\delta T} = \frac{m}{T} - \frac{\alpha_{VT}}{V_G - V_T} \quad (38)$$

As a result, the temperature coefficient of the FGR can be tuned by changing $V_G$.

The input capacitors, $C_{g1}$ and $C_{g2}$, may be sized as 2016 fF and 784 fF, respectively, to obtain a scale factor of χ=0.72. The scaled resistors are implemented by using scaled transistors with W=1.2 μm, and L=2.4 μm, 4.8 μm, 9.6 μm, and 19.2 μm.

Long-term and short-term drift of the DAC can be helpful, as it determines DAC reliability. The short-term drift can be observed shortly after the floating-gate programming, and can be minimized by decreasing the number of injection pulses for the fine tuning of the devices. It can be observed that after programming the DAC for 15-bit accuracy, the linearity drops to around 14-bit. The effective threshold voltages of the FGRs can be obtained from their gate sweeps. It can be observed that this coefficient can be changed from −2500 ppm/° C. to 3300 ppm/° C. Long-term drift can be caused by the thermionic emission. The resistance change over time can be found by using the following equation $$\frac{g_m(t)}{g_m(t_0)} = \Phi(t, T) + \frac{\beta V_T}{g_m(t_0)}[\Phi(t, T) - 1] \quad (39)$$

where $$\Phi(t, T) = \exp\left[-tv.\exp\left(\frac{-\phi_B}{kT}\right)\right], g_m = 1/R$$

is the conductance, v is a relaxation frequency of electrons in poly-silicon $\phi_B$ is the Si—SiO$_2$ barrier potential, and k is the Boltzmann's constant. Worst case results can be obtained after a first stress test at 300° C. After the first stress test, the charge loss of the FGRs can decrease considerably. The $\phi_B$ and v can be extracted as 0.9 eV and 60s$^{-1}$. Based on this worst-case data, it can be calculated that the FGR resistance drifts 1.6 10$^{-3}$% over the period of 10 years at 25° C.

FIG. 10 is a schematic diagram that illustrates another exemplary embodiment of a floating-gate resistor having a common mode circuit. The floating-gate resistor circuit 1000, like the floating gate resistor circuits shown in FIGS. 7-9, comprises the programming circuit 750 and a resistor circuit 1075.

The resistor circuit 1075 shown in FIG. 10 is coupled to the floating-gate 704g in the programming circuit 750. The resistor circuit 1075 includes a transistor $M_R$ 1002. The source 1002s of the transistor $M_R$ 1002 is connected to a source voltage $V_s$ 1004. The source 1002s is coupled to the gate 1002*g* via a gate capacitor 1006, and is also coupled to an input of a common mode circuit 1008. The drain 1002*d* is connected to a drain voltage $V_d$ 1010, and is also coupled to the floating gate 1002*g* via a gate capacitor 1012, and is further coupled to an input of the common mode circuit 1008. The output of the common mode circuit 1008 is connected to the well 1002*w* of the transistor $M_R$ 1002.

In contrast to the circuits 700 and 900, the circuit 1000 includes a feedback voltage applied to a well 1002*w* to further reduce the inherent nonlinearities of a MOS transistor. The common-mode gate and well voltages can be computed by the gate capacitors 1006 and 1012. As the drain 1002*d* and source 1002*s* are capacitively coupled to the gate of the buffer input shown in FIG. 11, a quiescent well potential is obtained by programming (in this case by tunnelling) the charge enough to obtain the voltage needed for the operation of the resistor. As a result, the nonlinearities may be reduced down to cubic ordered distortion levels as shown in (39).

If this embodiment is designed for low frequencies, then it is possible to make $C_g$ large compared to the oxide and overlap capacitances of the transistors to keep the distortion in cubic ordered level. If, however, this resistor is designed to operate in high frequencies where capacitive loading at the input terminals becomes a concern, then input terminals are buffered, or $C_g$ has to be smaller. In this case, an error term, $\epsilon$, is introduced to (39) to represent the scaling error of the common-mode voltage, $$I_d = \frac{\mu' C_{ox} W}{L}$$

$$\left\{ [V_G - V_T](v_d - v_s) - \frac{\varepsilon}{2}(v_d^2 - v_s^2) + \frac{\gamma(1 + \theta'[V_G - V_T])}{96\sqrt[3]{V_B + \phi}}(v_d - v_s)^3 \right\}$$ (40)

In contrast to other resistors, voltage sweeps from circuit 1000 may be more linear than the voltage sweeps of circuit 700 and circuit 900. Further, circuit 900 may exhibit a more linear characteristic than circuit 700 does. Scaled gate linearization techniques can compensate for the fundamental quadratic component, and for the body-effect.

It can be shown that the resistance of circuit 1000 can change more than the resistance of other circuits 700 and 900, and may provide the best response in terms of linearity, among the three embodiments. Also, from −5V to +5V, the resistance sweep of these resistors can exhibit small changes for smaller resistance values, and larger changes for larger resistance values. While decreasing the resistance of the floating-gate resistors, the quiescent gate voltage can be increased. In response, the transistor may stay in the deep triode region even for large differential input signals. Moreover, the nonlinearity of these structures can be a function of the quiescent gate voltage. This is true for circuit 1000, since (24) becomes very small for large gate voltages.

Dynamic measurements of floating-gate resistors can be obtained by using an off-chip inverting amplifier having a corresponding feedback resistor (which matches the resistance of on-chip resistors). Also, a 1 kHz sine-wave with 2.5V offset and 1V amplitude can be applied to the input terminal of the floating-gate resistors. Power spectrums may then be calculated.

As expected, circuit 1000 results the most linear response as compared with circuits 700 and 900. Also, resistance of the floating-gate resistors may not change more than approximately 1 percent. While much higher linearity is obtainable with the embodiment of circuit 1000, the accuracy of the measurements is limited by the equipment, and therefore at most nine-bit linearity can be obtained. Also, another linearity test of these resistors can be performed with a sine wave that has different peak-to-peak amplitudes, in order to observe the degradation in the resistance for larger input voltages.

A circuit 1100 of FIG. 11 comprises a highly linear source follower, programming circuitry, and input capacitors. The input capacitors compute the common-mode voltage and apply it to the input of the buffer. $V_{bias}$ can be used to set the current through the circuit, and $V_{cascode}$ can suppress effects on the output voltage on the bias current. The computed common-mode voltage can be tracked by the buffer circuit and then applied to the well.

As one skilled in the art would recognize, the various circuits in FIGS. 7-10 illustrating floating-gate resistors can be selected based on design criteria and the desired benefits.

Accordingly, it may be seen that a significantly more advantageous DAC may be provided in accordance with the present inventions. Those of ordinary skill in the art will recognize the significant benefits provided by the present invention. The DACs described herein provide substantial improvement over existing technology by providing a compact accurate DAC that is scalable to high levels of resolution. One significant advantage of the present invention over existing technologies is the substantially constant footprint of each successive ladder leg of the DAC. Due to the tunable characteristics of the present invention, each ladder leg may be customized to provide desired outputs without necessitating large components. Specifically, the capacitor network design allows high resolution designs without the inclusion of large footprint capacitors. This is accomplished using epots in series with a capacitor in each leg of the ladder circuit. The epots control the voltage fed its associated capacitor.

Additionally, when the DAC is implemented with a tunable floating-gate resistor ladder network, as shown in FIG. 6, the resulting circuit yields a small footprint and easily scales to high resolution.

The tunable floating-gate resistors that are described herein provide accurate resistances in CMOS technologies using standard CMOS fabrication techniques. Those skilled in the art will recognize that these resistors described herein are suitable for many applications, and are not limited to use in the DACs described. Specifically, these compact and highly accurate resistors fill a significant need in the art to provide resistive elements for numerous on chip applications, including CMOS applications. The DAC implementation described herein is merely an exemplary embodiment of the suitable uses for such resistors and those of skill in the art will appreciate that the resistors may be utilized in any CMOS application in which resistors are desired.

While the invention has been disclosed in its preferred forms, it will be apparent to those skilled in the art that many modifications, additions, and deletions can be made therein without departing from the spirit and scope of the invention and its equivalents, as set forth in the following claims.

What is claimed is:

1. A digital to analog converter comprising:
   an operational amplifier having an inverting input, a noninverting input, and an output;
   a first ladder element having a first epot for providing a first voltage, a first capacitor having a first capacitance, an input, and an output, and a first switch for selecting one of the first voltage and a reference voltage as a first selected voltage and for providing the first selected voltage to the input of the first capacitor; and a second ladder element having a second epot for providing a second voltage, a second capacitor having a second capacitance, an input and an output, and a second switch for selecting one of the second voltage and the reference voltage as a second selected voltage and for providing the second selected voltage to the input of the second capacitor;

wherein the output of the first capacitor is connected to the output of the second capacitor and to the inverting input of the operational amplifier.

2. The digital to analog converter of claim 1, wherein the first capacitance is substantially equal to the second capacitance.

3. The digital to analog converter of claim 1, wherein the first ladder element has a first size, and second ladder element has a second size, and the first size and the second size are substantially equal.

4. The digital to analog converter of claim 3, wherein the operational amplifier, the first ladder element, and the second ladder element are fabricated in CMOS.

5. The digital to analog converter of claim 1, further comprising a feedback capacitor coupled between the inverting input of the operational amplifier and the output of the operational amplifier.

6. A digital to analog converter comprising:
an operational amplifier having an inverting input, a noninverting input, and an output;
a first ladder element having a first floating gate tunable resistor having a first impedance, an input, and an output, and a first switch for alternatively connecting the input of the first floating gate tunable resistor to either a first voltage or to a second voltage; and
a second ladder element having a second floating gate tunable resistor having a second impedance, an input, and an output, and a second switch for alternatively connecting the input of the second floating gate tunable resistor to either the first voltage or to the second voltage;
wherein the output of the first floating gate tunable resistor is connected to the output of the second floating gate tunable resistor and to the inverting input of the operational amplifier.

7. The digital to analog convener of claim 6, further comprising a feedback resister coupled between the output of the operational amplifier and the inverting input of the amplifier.

8. The digital to analog converter of claim 6, wherein the first voltage is a reference voltage.

9. The digital to analog converter of claim 6, wherein the second voltage is ground.

10. The digital to analog converter of claim 6, wherein the first floating gate tunable resistor further comprises:

a programming circuit having a first floating gate transistor with a first source, a first floating gate, and a first drain; and
a resistor circuit having a second floating gate transistor with a second source, a second floating gate, and a second drain;
wherein the first floating gate and the second floating gate are electrically coupled together.

11. The digital to analog converter of claim 10, wherein the programming circuit further comprises:
a first tunneling capacitor having a first connection and a second connection, the first connection of the first tunneling capacitor being coupled to the first floating gate, and the second connection of the first tunneling capacitor being adapted to receive a first tunneling voltage for resetting a charge on the first floating gate.

12. The digital to analog convener of claim 10, wherein the resistor circuit further comprising:
a first gate capacitor having a first connection coupled to the second drain of the second floating gate transistor, and a second connection coupled to the second floating gate of the second floating gate transistor; and
a second gate capacitor having a first connection coupled to the second source of the second floating gate transistor, and a second connection coupled to the second floating gate of the second floating gate transistor.

13. The digital to analog convener of claim 10, wherein the second floating gate transistor includes a well, and wherein the resistor circuit further comprises:
a first buffer having an output coupled to the well of the second floating gate transistor and an input;
a first well capacitor having a first connection coupled to the second source of the second floating gate transistor and a second connection coupled to the input of the first buffer; and
a second well capacitor having a first connection coupled to the second drain of the second floating gate transistor and a second connection coupled to the input of the first buffer.

14. The digital to analog convener of claim 13, wherein the resistor circuit further comprises:
a third floating gate transistor having a third source, a third floating gate, and a third drain; and
a second tunneling capacitor having a first connection coupled to the third floating gate, and a second connection being adapted to receive a second tunneling voltage for resetting a charge on the third floating gate.

* * * * *